(12) United States Patent
Murata et al.

(10) Patent No.: US 8,114,574 B2
(45) Date of Patent: Feb. 14, 2012

(54) PHOTOSENSITIVE RESIN COMPOSITION

(75) Inventors: Yoshiaki Murata, Ichihara (JP); Hironobu Itou, Ichihara (JP)

(73) Assignee: DIC Corporation, Tokyo (JP)

( * ) Notice: Subject to any disclaimer, the term of this patent is extended or adjusted under 35 U.S.C. 154(b) by 55 days.

(21) Appl. No.: 11/994,043

(22) PCT Filed: Jan. 24, 2006

(86) PCT No.: PCT/JP2006/301019
§ 371 (c)(1),
(2), (4) Date: Feb. 17, 2009

(87) PCT Pub. No.: WO2007/004334
PCT Pub. Date: Jan. 11, 2007

(65) Prior Publication Data
US 2009/0233231 A1 Sep. 17, 2009

(30) Foreign Application Priority Data

Jun. 30, 2005 (JP) ................................. 2005-191846

(51) Int. Cl.
*G03F 7/004* (2006.01)
(52) U.S. Cl. ............... 430/285.1; 430/286.1; 430/287.1; 522/100; 525/450
(58) Field of Classification Search ....................... None
See application file for complete search history.

(56) References Cited

U.S. PATENT DOCUMENTS

| | | | | |
|---|---|---|---|---|
| 5,849,857 A | * | 12/1998 | Awaji et al. | ........ 528/98 |
| 5,858,618 A | | 1/1999 | Tzou | |
| 2003/0218123 A1 | * | 11/2003 | Harada et al. | ........ 250/226 |

FOREIGN PATENT DOCUMENTS

| | | |
|---|---|---|
| JP | 64-14224 A | 1/1989 |
| JP | 9-80749 A | 3/1997 |
| JP | 10-282665 A | 10/1998 |
| JP | 11-24254 A | 1/1999 |
| JP | 11-327150 A | 11/1999 |
| JP | 2000-267275 A | 9/2000 |
| JP | 2000-338665 A | 12/2000 |
| JP | 2001-26624 A | 1/2001 |
| JP | 2001-247649 A | 9/2001 |
| JP | 2001-264977 A | 9/2001 |
| JP | 2003-233178 A | 8/2003 |
| JP | 2004-300265 A | 10/2004 |
| JP | 2004-300266 A | 10/2004 |

OTHER PUBLICATIONS

English translation of JP, 2000-338665 , A (2000) from machine translation from AIPN Japan Patent Office National Center for Industrial Property Information and Training, generated Apr. 23, 2010, 14 pages.*
AN 2000:863752, ACS on STN database, file CAPLUS and RN numbers related from REG file, English abstract of JP 2000338665 A, Endo et al, entered in STN Dec. 11, 2000, 13 pages.*
Derwent-Acc-No. 2001-310248, Derwent week 200133, English abstract of JP 2000338665 A with publication date of Dec. 8, 2000, Derwent Information LTD, obtained from Derwent files on EAST database at USPTO, 3 pages printed May 6, 2010.*
International Search Report of PCT/JP2006/301019, date of mailing Feb. 21, 2006.
European Search report dated Apr. 29, 2009, issued in corresponding European Patent Application No. 06712235.8.
Anonymous; "Kresol Novolak Epoxid-Harze N-600 Series"; Data Sheet, Online, URL: http://web.archive.org/web/20050404111/255/ http://dic-europe.dr/download/epoxy_ec_ger.pdf, Apr. 4, 2005.

* cited by examiner

*Primary Examiner* — Cynthia Hamilton
(74) *Attorney, Agent, or Firm* — Westerman, Hattori, Daniels and Adrian, LLP

(57) ABSTRACT

A photosensitive resin composition of the present invention includes an acid group-containing vinyl ester resin and a photopolymerization initiator as essential components, wherein the acid group-containing vinyl ester resin is an acid group-containing vinyl ester resin having a multiple-branched molecular structure obtained by the following steps where a polybasic anhydride (a3) is reacted with an epoxy vinyl ester resin (v1) that is a reaction product of an aromatic epoxy resin (a1) and a radically-polymerizable unsaturated-double bond-containing monocarboxylic acid (a2); a radically-polymerizable unsaturated-double bond-containing monoepoxy compound (a4) is subsequently reacted with an acid group formed by the reaction; and a polybasic anhydride (a3) is subsequently reacted with a secondary hydroxyl group formed by the reaction of the compound (a4) with the acid group, thereby obtaining the acid group-containing vinyl ester resin having a multiple-branched molecular structure; and contains 1.75 to 3.5 radically-polymerizable unsaturated double bonds per aromatic ring in the acid group-containing vinyl ester resin, and the acid groups within a range where the acid value of the acid group-containing vinyl ester resin reaches 30 to 150 mg KOH/g. According to the present invention, a resin composition for a resist ink that simultaneously has ultrahigh sensitivity, excellent developability, and broad heat control range can be provided.

6 Claims, No Drawings

PHOTOSENSITIVE RESIN COMPOSITION

TECHNICAL FIELD

The present invention relates to a resin composition for a resist ink which has excellent sensitivity to actinic energy rays in particular and which has good alkali developability and a broad heat control range during predrying.

BACKGROUND ART

As a solder resist patterning method for a print wiring board, alkali developing methods are widely used due to the excellent chemical or solvent resistance of the cured film. Thus, for an alkali-developing-type resist ink that is used for this alkali developing method, an acid-pendant-type epoxy vinyl ester compound obtained by reacting an unsaturated monocarboxylic acid with an epoxy resin and then adding a polybasic anhydride thereto is generally used as a main component.

Recently, as an exposure system employed for a solder resist patterning method by the alkali developing method, a direct exposure method by a laser beam (laser direct imaging method) has been proposed and attracted considerable attention. The direct exposure method using a laser beam is characterized by the formation of a more precise pattern compared to a conventional UV exposure method using a mask pattern. Therefore, it is an exposure method useful for making smaller or integrated base boards.

However, exposure energy obtained by a laser beam can be as small as about $1/10$ to $1/100$ of that of an UV ray. Sufficient curability cannot be attained with one of the alkali-developing-type resist ink used in the past. Accordingly, there is a need for a resist ink having ultrahigh sensitivity that can be used for such a direct exposure method using a laser beam.

Moreover, even in a current system in which curing is performed by a conventional type of mask pattern using a UV exposure method, the exposure energy during the solder resist patterning tends to decrease as the speed of production lines is increased. As a result, there is increasing need for a resist ink that has ultrahigh sensitivity and that exhibits excellent curability even if low exposure energy is used.

As such, as a solution to such higher sensitivity requirements, for example, a technique for achieving a highly sensitive photosensitive resin, in which an epoxy group-containing radically-polymerizable unsaturated monomer (one representative example of which is glycidyl methacrylate) is reacted with an acid-pendant-type epoxy vinyl ester compound obtained by reacting an epoxy resin with an unsaturated monocarboxylic acid and a dibasic anhydride to introduce a multiplicity of unsaturated double bonds into the polymer structure, thereby imparting high sensitivity thereto (see, for example, Patent Document 1).

However, when a vinyl ester resin is prepared by reacting an epoxy group-containing radically-polymerizable unsaturated monomer with an acid-pendant-type epoxy vinyl ester compound, the epoxy group-containing radically-polymerizable unsaturated monomer is reacted with a carboxylic group in the acid-pendant-type epoxy vinyl ester compound whereby acid groups therein are consumed. As a result, this could not avoid a reduction in alkali developability. Further, when the epoxy group-containing radically-polymerizable unsaturated monomer is blended with the vinyl ester resin to provide more ultrahigh sensitivity, not only is the development rate remarkably lowered, but a "heat control range" applicable in predrying also becomes extremely narrow, thus being unfavorable. The term "heat control range" applicable in the predrying refers to a thermally acceptable limit in the heat drying where the coating film is heat-dried, and then, an unexposed portion of the film is developed, or a control range of the heat-drying conditions that is allowable to maintain developability. Thus, if the heat control range is narrow, the resin composition of the coating film curing under time or temperature conditions outside the acceptable range during the drying process where a solvent is removed after an alkali-developing-type resist ink is applied to a print wiring board and the solvent is removed. Consequently, even if the film is exposed and developed after the drying process, it is difficult to remove the unexposed portion due to the presence of the developing solution. Therefore, a problem has been caused in that the solvent remains thereon even after the development, thereby causing tackiness, since sufficient drying cannot be performed.

As described above, such a type of vinyl ester resin obtained by reacting a conventional epoxy group-containing radically-polymerizable unsaturated monomer with an acid-pendant-type epoxy vinyl ester compound causes deterioration in the alkali developability and the narrower heat control range in predrying when the level of modification of the epoxy group-containing radically-polymerizable unsaturated monomer is increased to achieve the above-described ultrahigh sensitivity that has been sought in recent years because the acid value required for the alkali developability and the number of unsaturated double bonds that contribute to the sensitivity become inversely proportional to each other. On the other hand, if the level of modification is suppressed to increase the alkali developability and the heat control range in predrying, the ultrahigh sensitivity, which has been sought in recent years could not be attained.

Accordingly, the field of alkali-developing-type resist ink is still in a situation where the ink is not applicable to the direct exposure method using a laser beam, and where it is impossible for the ink to have ultrahigh sensitivity that can exhibit excellent curability even if low exposure energy is applied thereon; excellent developability; and a broad heat control range, simultaneously.

Patent Document 1: Japanese Unexamined Patent Publication No. 10-282665 (pages 3 to 5)

DISCLOSURE OF THE INVENTION

It is an object of the present invention to provide a composition for an alkali-developing-type resist ink that is applicable to a direct exposure method using a laser beam, and that has ultrahigh sensitivity, which makes it possible to exhibit excellent curability even if low exposure energy is used; excellent developability; and a broad heat control range, simultaneously. Further, it is another object of the present invention to provide a vinyl ester resin that can impart these properties to the composition for an alkali-developing-type resist ink.

The present inventors carried out extensive studies in order to solve the above-described problems. As a result, they discovered that, by reacting an epoxy group-containing radically-polymerizable unsaturated monomer and a polybasic anhydride with an acid-pendant-type epoxy vinyl ester compound, the molecular structure of the vinyl ester resin can be formed into a "multi-step-wise" and highly-branched structure whereby not only can a acid value sufficient for the alkali development be attained, but unsaturated double bonds can be also introduced into the termini of the branched structure in high concentrations. They finally discovered that this drastically improves sensitivity of the vinyl ester resin. Based on this discovery, they achieved the present invention.

Specifically, the present invention relates to a photosensitive resin composition, including an acid group-containing vinyl ester resin (A) and a photopolymerization initiator (B) as essential components, wherein the acid group-containing vinyl ester resin (A) is an acid group-containing vinyl ester resin having a multiple-branched molecular structure obtained by the following steps where a polybasic anhydride (a3) is reacted with an epoxy vinyl ester resin (v1) that is a reaction product of an aromatic epoxy resin (a1) and a radically-polymerizable unsaturated-double bond-containing monocarboxylic acid (a2); a radically-polymerizable unsaturated-double bond-containing monoepoxy compound (a4) is subsequently reacted with an acid group formed by the reaction; and a polybasic anhydride (a3) is subsequently reacted with a secondary hydroxyl group formed by the reaction of the compound (a4) with the acid group, thereby obtaining the acid group-containing vinyl ester resin having a multiple-branched molecular structure; and contains 1.75 to 3.5 radically-polymerizable unsaturated double bonds per aromatic ring in the acid group-containing vinyl ester resin, and the acid groups within a range where the acid value of the acid group-containing vinyl ester resin (A) reaches 30 to 150 mg KOH/g.

Moreover, the present invention also relates to a novel vinyl ester resin, which is an acid group-containing vinyl ester resin having a multiple-branched molecular structure obtained by the following steps where a polybasic anhydride (a3) is reacted with an epoxy vinyl ester resin that is obtained by reacting an (meth)acrylic acid or a modified product of an aliphatic cyclic ester compound thereof with a novolak-type epoxy resin; a radically-polymerizable unsaturated double bond-containing monoepoxy compound (a4) is subsequently reacted with an acid group formed by the reaction; and a polybasic anhydride (a3) is subsequently reacted with a secondary hydroxyl group formed by the reaction of the compound (a4) with the acid group, thereby obtaining the acid group-containing vinyl ester resin having a multiple-branched molecular structure; and which contains 1.75 to 3.5 radically-polymerizable unsaturated double bonds (b4) per aromatic ring in the acid group-containing vinyl ester resin, and the acid groups within a range where the acid value of the acid group-containing vinyl ester resin reaches 30 to 150 mg KOH/g.

According to the present invention, a composition for an alkali-developing-type resist ink that is applicable to a direct exposure method using laser beam, and that simultaneously has ultrahigh sensitivity which makes it possible to exhibit excellent curability even if low exposure energy is used; excellent developability; and a broad heat control range, and a vinyl ester resin that can impart these properties to the composition for an alkali-developing-type resist ink can be provided.

Accordingly, the composition for an alkali-developing-type resist ink of the present invention has excellent sensitivity to actinic energy rays. Therefore, not only is the composition compatible to the direct exposure method using laser beam and to an energy-saving type curing system that has excellent productivity, but, because the composition has alkali developability and a broad heat control range in pre-drying, the composition also has excellent drying properties whereby the composition can provide a cured product having good balance among the properties such as adhesiveness, soldering heat resistance, chemical resistance, solvent resistance or the like in the coating film obtained after thermal curing.

BEST MODE FOR CARRYING OUT THE INVENTION

The acid group-containing vinyl ester resin (A) used in the present invention has a molecular structure obtained by the following steps: an aromatic epoxy resin (a1) is reacted with a radically-polymerizable unsaturated double bond-containing monocarboxylic acid (a2) to form an epoxy vinyl ester resin (v1); a polybasic anhydride (a3) is then reacted with a secondary hydroxyl group formed by the reaction to form a acid group; a radically-polymerizable unsaturated double bond-containing monoepoxy compound (a4) is then reacted with the acid group to introduce a radically-polymerizable unsaturated double bond to termini of the molecule; and a polybasic anhydride (a3) is then reacted with a secondary hydroxyl group formed by the reaction to form a new acid group in the molecule. In this way, the secondary hydroxyl group in the epoxy vinyl ester resin (v1) becomes a branching point to give a higher molecular weight, and thus the acid group-containing vinyl ester resin (A) forms a structure that is multiple-branched as a whole.

Furthermore, the vinyl ester resin having a multiple-branched structure that includes a radically-polymerizable unsaturated double bond and an acid group, formed by the above-described method, can be formed into a high dimensional acid group-containing vinyl ester resin by a reaction in which the resin is further reacted with a radically-polymerizable unsaturated double bond-containing monoepoxy compound (a4), then reacted with a polybasic anhydride (a3), and further reacted with these components, alternately, several times in this order.

Therefore, if the terminal unsaturated double bond in the epoxy vinyl ester resin (v1) is to be a first generation of the radically-polymerizable unsaturated double bonds, the secondary hydroxyl group in the resin is reacted with the polybasic anhydride (a3). Then, if the radically-polymerizable unsaturated double bond-containing monoepoxy compound (a4) is reacted with the acid group formed by ring-opening of the polybasic anhydride (a3), then, the unsaturated double bond introduced by the radically-polymerizable unsaturated double bond-containing monoepoxy compound (a4) would be a second generation of the radically-polymerizable unsaturated double bonds. Similarly, if the polybasic anhydride (a3) is reacted with the secondary hydroxyl group in the resin, and, a radically-polymerizable unsaturated double bond-containing monoepoxy compound (a4) is subsequently reacted, then, the radically-polymerizable unsaturated double bond introduced by the reaction would be a third generation of the radically-polymerizable unsaturated double bonds.

As used herein, the aromatic epoxy resin (a1) is an epoxy resin having a structure in which an aromatic ring such as a benzene ring or a naphthalene ring is nuclear-substituted with a glycidyloxy group. A cured product obtained by curing the acid group-containing vinyl ester resin (A) that is consequently obtained using such an epoxy resin as a raw material has excellent heat resistance, strength of coating film, and chemical resistance. Examples of the aromatic epoxy resin (a1) include a novolak-type epoxy resin obtained by the reaction of a novolak resin such as a phenol novolak resin, a cresol novolak resin, a halogenated phenol novolak resin, a phenol novolak resin having an alkyl group having 2 to 4 carbon atoms as a substituent, and a naphthol novolak resin with epichlorohydrin, methylepichlorohydrin, or the like; a diglycidyl ether of a bisphenol obtained by the reaction of a bisphenol such as bisphenol A, bisphenol F, bisphenol S, and tetrabromobisphenol A with epichlorohydrin, methylepichlorohydrin, or the like; a high molecular weight bisphenol-type epoxy resin obtained by further increasing the molecular weight of the diglycidyl ether of a bisphenol with bisphenol A, bisphenol F, bisphenol S, tetrabromobisphenol A, or the like; a modified bisphenol-type epoxy resin obtained by increasing the molecular weight of the diglycidyl ether of a bisphenol with a butyronitrile rubber having a carboxylic group at a terminal, a polyester having a carboxylic group at a terminal, a dibasic acid, or the like; a naphthalene-based epoxy resin such as a diglycidyl ether of dihydroxynaphthalene, and a tetraglycidyl ether of bis(2,7-dihydroxynaphthyl)methane; a trisphenolmethane-type epoxy resin obtained by the reaction of trisphenolmethane, triscresolmethane, or the like with epichlorohydrin, methylepichlorohydrin, or the like; and biphenyldiglycidyl ether.

Among these, a polyfunctional epoxy resin having repeating units is preferred since it can efficiently increase the number of double bonds in one molecule, and the novolak-type epoxy resin is particularly preferred since it gives a cured product, obtained therefrom, a excellent heat and chemical resistance. For the novolak-type epoxy resin, the average number of nuclei of 4 to 11 is preferred since a branched vinyl ester resin consequently obtained therefrom can easily have a spherical structure, and can easily exhibits excellent sensitivity, and the branched vinyl ester resin has an appropriately low viscosity and excellent workability when it is used as a resist ink and excellent drying properties during predrying. Furthermore, among these novolak-type epoxy resins, a phenol novolak resin, a cresol novolak resin, and a phenol novolak resin having an alkyl group having 2 to 4 carbon atoms as a substituent are particularly preferred due to their excellent balance between flowability and heat resistance.

In addition, the aromatic epoxy resin (a1) preferably has a softening point within a range of 50 to 105° C., and particularly preferably within the range of 65 to 100° C. due to good drying properties during predrying when the resulting composition is used as a resist ink, and heat resistance of a cured product obtained therefrom.

As an example of the radically-polymerizable unsaturated double bond-containing monocarboxylic acid (a2), (meth)acrylic acid (a2-1); or an unsaturated compound (a2-2) having at least two ester bonds in one molecule and having a carboxylic group at one terminal of the molecule can be mentioned. Among these, the (meth)acrylic acid (a2-1) is preferred since the concentration of the radically-polymerizable unsaturated double bonds is increased, thereby providing good sensitivity. On the other hand, the unsaturated compound (a2-2) having at least two ester bonds in one molecule and having a carboxylic group at one terminal of the molecule is preferred since the polarity of an acid group-containing vinyl ester resin consequently obtained therefrom is increased, thereby providing good alkali developability. Examples of the unsaturated compound (a2-2) include a compound obtained by reacting a dibasic anhydride such as succinic anhydride, maleic anhydride, and tetrahydrophthalic anhydride with an aliphatic polyester polyol to obtain a half ester, followed by reacting the half ester with a (meth)acrylic acid; or a compound represented by the following formula (1):

General Formula (1)

[Formula 1]

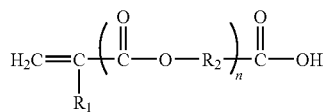

(wherein $R_1$ represents a hydrogen atom or a methyl group, $R_2$ represents a hydrocarbon group having 2 to 6 carbon atoms, and n represents an integer of 1 to 6). Examples of the compound represented by the general formula (1) include a polylactone (meth)acrylate obtained by reacting ε-caprolactone with a (meth)acrylic acid, thereby extending the molecule; or a (meth)acrylic acid dimer.

Among the above-mentioned unsaturated compounds (a2-2), the compound represented by the general formula (1) is particularly preferable since excellent alkali developability can be provided. In particular, if n is 1 to 6 in the general formula (1), sufficient flexibility can be imparted to the cured product thereof whereby it can be applied to a flexible base board that has been increasingly demanded recently.

Moreover, it is preferable that the compound represented by the general formula (1) in which n is 1 to 6 be used in combination with (meth)acrylic acid. In this case, it is preferable that the molar ratio of the compound of the general formula (1): the (meth)acrylic acid be in a range of 20:80 to 99:1 since the acid group-containing vinyl ester resin (A) obtained has excellent balance among sensitivity, developability, and drying properties during predrying when the resin (A) is used as the resist ink.

Further, examples of the polybasic anhydride (a3) include aliphatic acid anhydrides such as maleic anhydride, succinic anhydride, itaconic anhydride, dodecyl succinic anhydride, tetrahydrophthalic anhydride, hexahydrophthalic anhydride, 3-methyltetrahydrophthalic anhydride, 4-methyltetrahydrophthalic anhydride, 3-methylhexahydrophthalic anhydride, 4-methylhexahydrophthalic anhydride, 3,4-dimethyltetrahydrophthalic anhydride, 4-(4-methyl-3-pentenyl)tetrahydrophthalic anhydride, 3-butenyl-5,6-dimethyltetrahydrophthalic anhydride, 3,6-endomethylene-tetrahydrophthalic anhydride, 7-methyl-3,6-endomethylenetetrahydrophthalic anhydride, and benzophenonetetracarboxylic anhydride; and aromatic acid anhydrides such as phthalic anhydride, tetrachlorophthalic anhydride, tetrabromophthalic anhydride, chlorendic anhydride, trimellitic anhydride, pyromellitic anhydride, and benzophenonetetracarboxylic anhydride.

Among these, tetrahydrophthalic anhydride or hexahydrophthalic anhydride is preferable since the solvent-solubility of the acid group-containing vinyl ester resin (A) thereof is excellent. Further, succinic anhydride is preferred since it particularly provides remarkably excellent heat control range or alkali developability when the resin is used as the resist ink. Accordingly, in the present invention, as the polybasic anhydride (a3), succinic anhydride, and tetrahydrophthalic anhydride or hexahydrophthalic anhydride are preferably used in combination. In particular, with respect to succinic anhydride, it is preferable that acid groups derived from the succinic anhydride be present in the finally-formed part of the "multi-step-wise" structure where the succinic anhydride is reacted in the final step in the synthesis of an acid group-containing vinyl ester resin (A) because this will provide remarkable improvement in heat control range or alkali developability.

The epoxy vinyl ester resin (v1), as specifically described above, which is obtained by reacting the aromatic epoxy resin (a1) with a radically-polymerizable unsaturated double bond-containing monocarboxylic acid (a2), is further reacted with a polybasic anhydride (a3) to from the acid group-containing vinyl ester resin (v2). When a novolak-type epoxy resin is used as the aromatic epoxy resin (a1), the acid group-containing vinyl ester resin (v2), for example, can be represented by the following general formula (2).

General Formula (2)

[Formula 2]

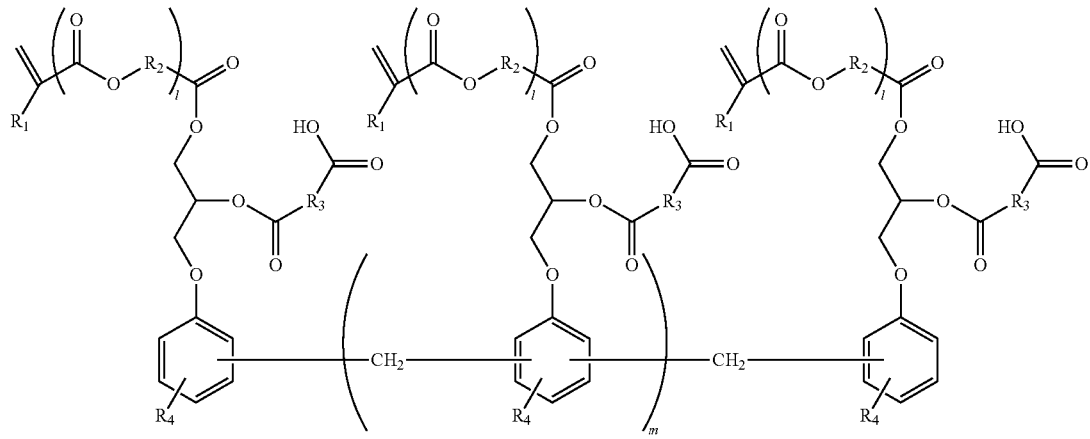

In general formula (2), $R_1$ and $R_2$ are defined in the same manner as the general formula (1); each 1 independently represents an integer of 0 to 6; $R_3$ represents a linear aliphatic hydrocarbon group or alicyclic hydrocarbon group having 2 to 10 carbon atoms; $R_4$ represents a hydrogen atom, a halogen atom, or an alkyl group having 1 to 4 carbon atoms; and m represents an integer of 0 to 9.

Furthermore, when a bisphenol-type epoxy resin is used as the aromatic epoxy resin (a1), the acid group-containing epoxy vinyl ester resin (v2) can be represented by the following general formula (3).

General Formula (3)

[Formula 3]

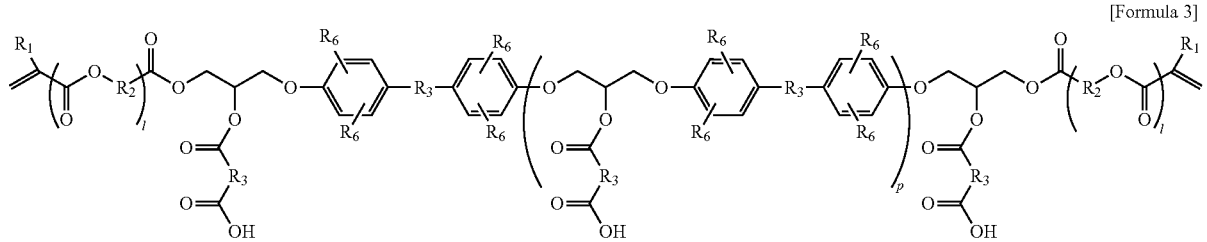

In general formula (3), $R_1$ and $R_2$ are defined in the same manner as the general formula (1), each 1 independently represents an integer of 0 to 6; $R_3$ represents a linear aliphatic hydrocarbon group or alicyclic hydrocarbon group having 2 to 10 carbon atoms; $R_6$ represents a hydrogen atom, a halogen atom, or an alkyl group having 1 to 4 carbon atoms; and p represents an integer of 0 to 4.

Among these, the epoxy vinyl ester resin in which a novolak-type epoxy resin is used as the aromatic epoxy resin (a1), (in particular, the acid-pendant-type epoxy vinyl ester resin represented by the above general formula (2)) is particularly preferable since a large amount of the radically-polymerizable unsaturated double bonds can be introduced into the polymer structure whereby the sensitivity of the acid group-containing vinyl ester resin (A) finally obtained can be improved.

The acid group vinyl ester resin (v2) is then reacted with a radically-polymerizable unsaturated double bond-containing monoepoxy compound (a4), and subsequently with a polybasic anhydride (a3) whereby a branched structure is formed. Consequently, second-generation double bonds, and further third- or more generation double bonds are formed therein to produce an acid group-containing vinyl ester resin (A). In the present invention, because the acid group-containing vinyl ester resin (A) has such a multiple-branched structure, the photosensitive resin composition thereof simultaneously has ultrahigh sensitivity, excellent developability, and broad heat control range.

The total number of the radically-polymerizable unsaturated double bonds that is introduced into the acid group-containing vinyl ester resin (A) in the above-described manner is such that 1.75 to 3.5 radically-polymerizable unsaturated double bonds are contained per aromatic ring in the acid group-containing vinyl ester resin (A). In the present invention, an increased number of the radically-polymerizable unsaturated double bonds are thus introduced into the resin structure, compared with a conventional acid group-containing vinyl ester resin whereby excellent ultrahigh sensitivity can be imparted thereto. As used herein, the expression "the number of the radically-polymerizable unsaturated double bonds per aromatic ring" means a value obtained by dividing the total number of the radically-polymerizable unsaturated double bonds by the total number of the aromatic rings constituting the resin (A). In addition, if the radically-polymerizable unsaturated double bond-containing monocarboxylic acid (a2) and the radically-polymerizable unsaturated double bond-containing monoepoxy compound (a4) are reacted in the equivalent amount or less, the total number of the moles of these added compounds can be calculated as the total number of the radically-polymerizable unsaturated double bonds. Accordingly, for example, if a novolak-type epoxy resin is used as the aromatic epoxy resin (a1), the value means the number of the radically-polymerizable unsaturated double bonds per benzene ring or naphthalene ring constituting the novolak resin. For example, if a compound represented by the general formula (2) is used as the acid group-containing epoxy vinyl ester resin (v2), the value is obtained by dividing the total number of the radically-polymerizable unsaturated double bonds in an acid group-containing vinyl ester resin (A) consequently obtained therefrom by [m+2]. On the other hand, if a bisphenol-type epoxy resin is used as the aromatic epoxy resin (a1) (for example, if the compound represented by the general formula (3) is used as the acid group-containing epoxy vinyl ester resin (v2)), the value is obtained by dividing the total number of the radically-polymerizable unsaturated double bonds by [2p+2] since the repeating unit of bisphenol has 2 aromatic rings.

Thus, the expression "contain 1.75 to 3.5 radically-polymerizable unsaturated double bonds per aromatic ring" means that a larger number of the radically-polymerizable unsaturated double bonds are contained in the molecular structure, compared with the molecular size of the acid group-containing vinyl ester resin (A). On the other hand, if more than 3.5 radically-polymerizable unsaturated double bonds are contained per aromatic ring in the molecular structure, then, sufficient heat resistance, strength of the coating film, and chemical resistance derived from the aromatic skeleton cannot be attained in the cured coating film thereof. From this viewpoint, in order to realize particularly excellent ultrahigh sensitivity, it is preferable that the number of radically-polymerizable unsaturated double bonds per aromatic ring in the acid group-containing vinyl ester resin be within a range of 2.0 to 3.5.

Furthermore, the acid value of the acid group-containing vinyl ester resin (A) is preferably within a range of 30 to 150 mgKOH/g, and more preferably within a range of 40 to 120 mgKOH/g since this can achieve excellent developability and a broad heat control range.

A specific structure of the acid group-containing vinyl ester resin (A) can be designed by selecting the types of the aromatic epoxy resin (a1), the radically-polymerizable unsaturated double bond-containing monocarboxylic acid (a2), the polybasic anhydride (a3) and the radically-polymerizable unsaturated double bond-containing monoepoxy compound (a4), and the reaction order thereof. For example, a case where a novolak-type epoxy resin is used as the aromatic epoxy resin (a1), and glycidyl methacrylate is used as the radically-polymerizable unsaturated double bond-containing monoepoxy compound (a4) is described below. The theoretical structure of an acid group-containing vinyl ester resin (A) thereof that contains the radically-polymerizable unsaturated double bonds up to the second generation and that contains 2 radically-polymerizable unsaturated double bonds per aromatic ring in the acid group-containing vinyl ester resin (A) can be represented by the following general formula (4).

General Formula (4)

[Formula 4]

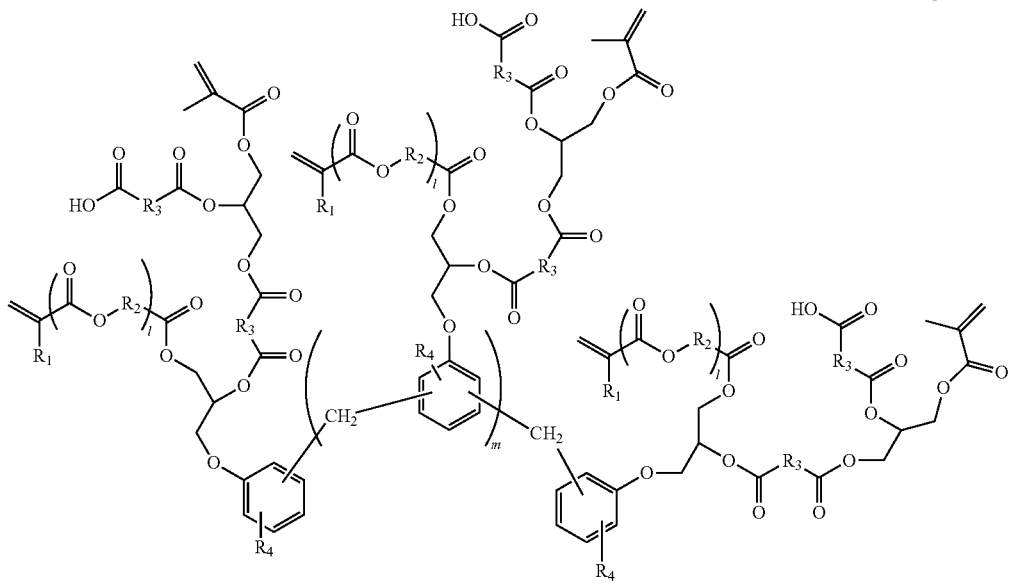

Furthermore, a resin (A) thereof that further contains the third-generation double bonds and that contains three double bonds at the terminal can be mentioned. That is, the theoretical structure thereof can be represented by the following general formula (5).

General Formula (5)

[Formula 5]

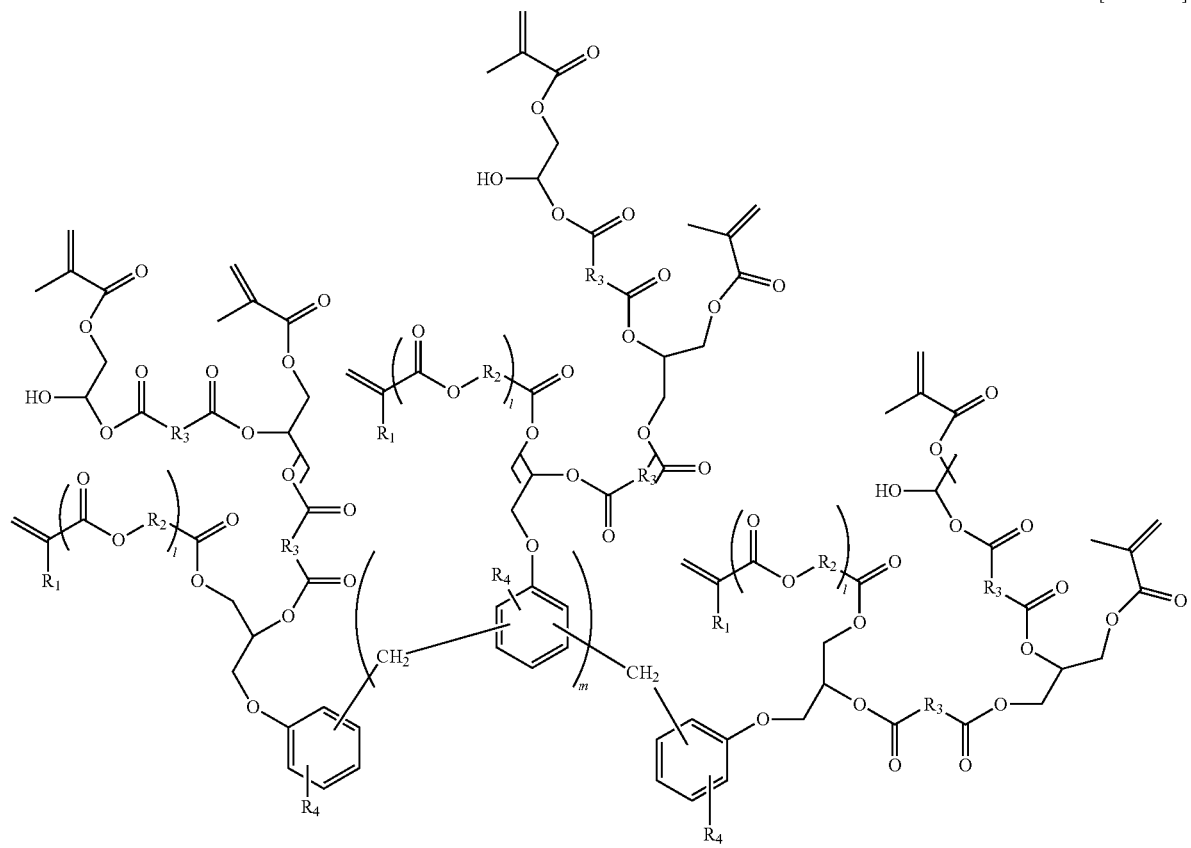

In the general formulas (4) and (5), $R_1$ and $R_2$ are defined in the same manner as in the general formula (1); each l independently represents an integer of 0 to 6; $R_3$ represents a linear aliphatic hydrocarbon group or alicyclic hydrocarbon group having 2 to 10 carbon atoms; $R_4$ represents a hydrogen atom, a halogen atom, or an alkyl group having 1 to 4 carbon atoms; and m represents an integer of 0 to 9.

Furthermore, a case where a bisphenol-type epoxy resin is used as the aromatic epoxy resin (a1), and glycidyl methacrylate is used as the radically-polymerizable unsaturated double bond-containing monoepoxy compound (a4) is described below. As an example of the acid group-containing vinyl ester resin (A) that includes the second-generation double bonds, the theoretical structural formula represented by the following general formula (5) can be mentioned. In addition, in the general formula (6), p represents an integer, which can be suitably selected such that 1.75 to 3.5 radically-polymerizable unsaturated double bonds are contained per aromatic ring in the acid group-containing vinyl ester resin (A).

General Formula (6)

[Formula 6]

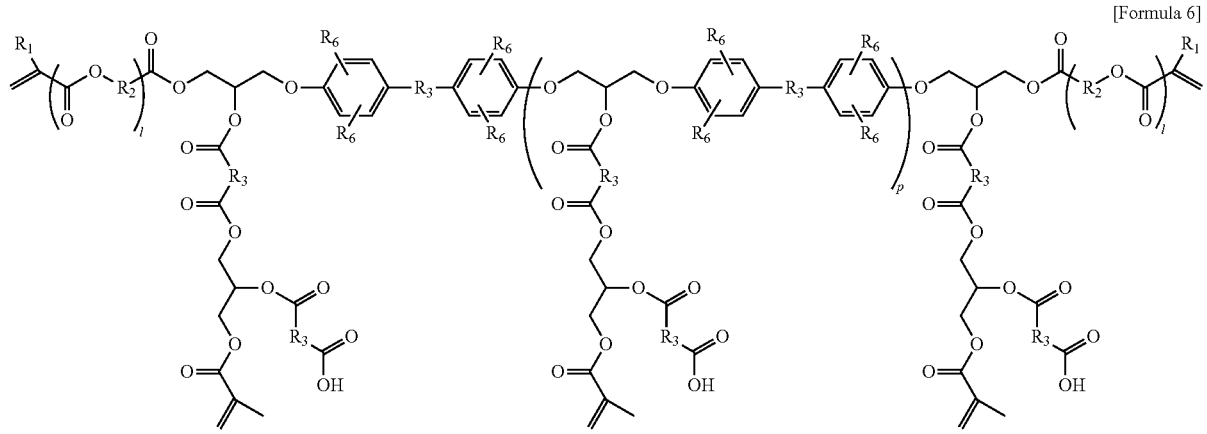

Furthermore, as an example of those having the third generation double bonds, a theoretical structural formula represented by the following general formula (7) can be mentioned. In addition, in the general formula (6), p represents an integer, which can be suitably selected such that 1.75 to 3.5 radically-polymerizable unsaturated double bonds are contained per aromatic ring in the acid group-containing vinyl ester resin (A).

General Formula (7)

[Formula 7]

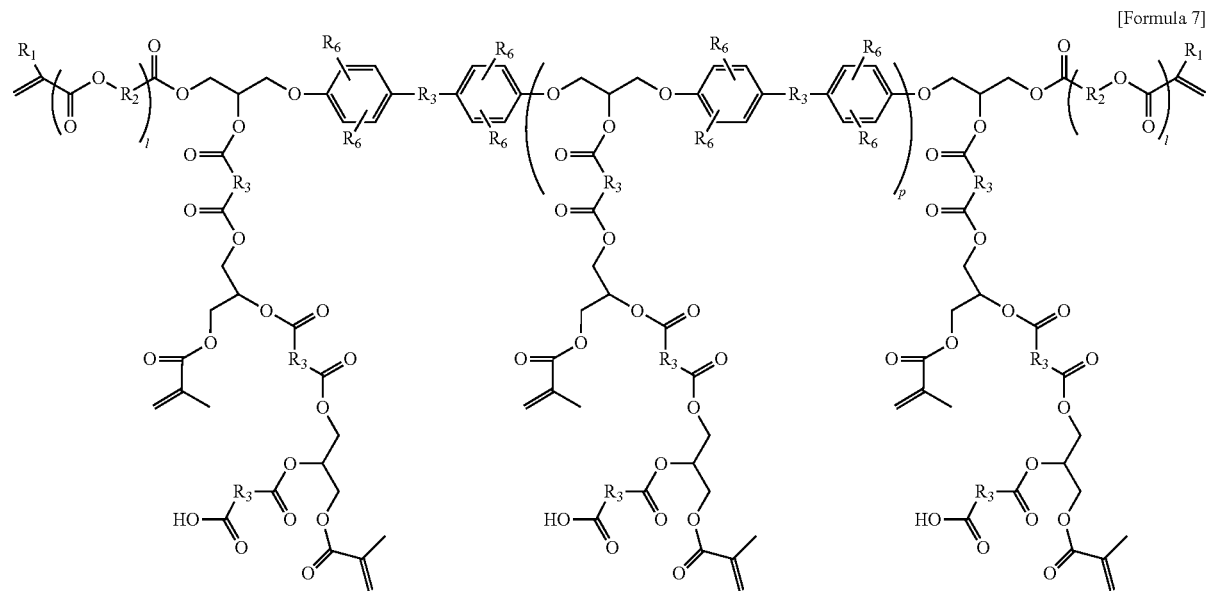

Among the acid group-containing vinyl ester resins (A) as specifically described, the resins in which a novolak-type epoxy resin is used as the aromatic epoxy resin (a1) are preferred since excellent radically-polymerizable unsaturated double bonds activity can be imparted thereto, thereby obtaining ultrahigh sensitivity, and excellent heat and chemical resistance can be also obtained. Therefore, it is preferable that the acid group-containing vinyl ester resin (A) be an acid group-containing vinyl ester resin where a (meth)acrylic acid or a modified product of an aliphatic cyclic ester compound thereof is reacted with the novolak-type epoxy resin that is a novel compound of the present invention; a radically-polymerizable unsaturated double bond-containing monoepoxy compound (a4) and a polybasic anhydride (a3) are subsequently reacted with an acid-pendant-type epoxy vinyl ester resin obtained by reacting a polybasic anhydride (a3) with a secondary hydroxyl group formed by the reaction to obtain the acid group-containing vinyl ester resin; and that the acid group-containing vinyl ester resin contain an acid group within a range where the acid value of the acid group-containing vinyl ester resin (A) reaches 30 to 150 mg KOH/g.

In order to prepare the acid group-containing vinyl ester resin (A) as specifically described above, for example, the following method 1 or 2 can be carried out.

First, the method 1 includes:

Step 1: A step in which a aromatic epoxy resin (a1) is reacted with a radically-polymerizable unsaturated double bond-containing monocarboxylic acid (a2), optionally in the presence of an esterification catalyst, to obtain an epoxy vinyl ester resin (v1);

Step 2: A step in which a polybasic anhydride (a3) is reacted with the obtained epoxy vinyl ester resin (v1) to obtain an acid group-containing vinyl ester resin (v2) that acid groups are bound to in a pendant form;

Step 3: A step in which an epoxy group-containing radically-polymerizable unsaturated monomer (a2) is reacted with the acid groups in the acid group-containing vinyl ester resin (v2) to obtain a vinyl ester compound (v3) that radically-polymerizable unsaturated groups are further introduced into; and Step 4: A step in which a polybasic anhydride (a3) is further reacted with secondary hydroxyl groups in the vinyl ester resin (v3) obtained in the Step 3 to obtain an objective acid group-containing vinyl ester resin (A).

That is, first, in Step 1, the aromatic epoxy resin (a1) is reacted with the radically-polymerizable unsaturated double bond-containing monocarboxylic acid (a2), optionally in the presence of an esterification catalyst, to obtain an epoxy vinyl ester resin (v1). In this case, in general, it is preferable that the reaction ratio of the radically-polymerizable unsaturated double bond-containing monocarboxylic acid (a2) to the aromatic epoxy resin (a1) be within a range where 0.8 to 1.1 moles of the radically-polymerizable unsaturated double bond-containing monocarboxylic acid (a2) are reacted with respect to 1 mole of an epoxy group of the aromatic epoxy resin (a1). This is because, if the radically-polymerizable unsaturated double bond-containing monocarboxylic acid (a2) is reacted within a range where the above-described ratio reaches 0.8 mole or more, then, gelation can be inhibited during the reaction with the polybasic anhydride (a3) in the subsequent step. Further, if the radically-polymerizable unsaturated double bond-containing monocarboxylic acid (a2) is reacted within a range where the ratio fulfills 1.1 moles or less, then, drying properties during predrying, heat and chemical resistance, plating resistance, or the like of the cured product thereof can be improved when the acid group-containing vinyl ester resin (A) consequently obtained therefrom is used as a resist ink. It is more preferable that the ratio be within a range of 0.90 to 1.05 moles since excellent balance in these properties can be achieve, and excellent sensitivity to actinic energy ray or storage stability of the resin composition can be also attained.

Examples of the esterification catalyst that can be used herein include tertiary amines such as triethylamine, N,N-dimethylbenzylamine, N,N-dimethylaniline, 2,4,6-tris (dimethylaminomethyl)phenol, and diazabicyclooctane; quaternary ammonium salts such as trimethylbenzylammonium chloride and methyltriethylammonium chloride; phosphines such as triphenylphosphine, and tributylphosphine; imidazoles such as 2-methylimidazole, 1,2-dimethylimidazole, and 2-ethyl-4-methylimidazole; and triphenylstibine.

Furthermore, in the reaction of Step 1, a diluent is preferably used since the use thereof can reduce the viscosity of the system. Examples of the diluent that can be used herein include ketones such as ethyl methyl ketone and cyclohexanone; aromatic hydrocarbons such as toluene, xylene, and tetramethylbenzene; glycol ethers such as dipropyleneglycol dimethyl ether and dipropyleneglycol diethyl ether; esters such as ethyl acetate, butyl acetate, butyl cellosolve acetate, propylene glycol monomethyl ether acetate, and diethylene glycol monoethyl ether acetate; aliphatic hydrocarbons such as octane and decane; organic solvents including petroleum-based solvents such as petroleum ether, petroleum naphtha, hydrogenated petroleum naphtha and solvent naphtha. Among these, it is particularly preferable to singularly use propylene glycol monomethyl ether acetate or diethylene glycol monoethyl ether acetate, to use propylene glycol monomethyl ether acetate and ketones in combination, or to use diethylene glycol monoethyl ether acetate and a petroleum-based solvent in combination since operability thereof during the reaction is excellent, and drying speed thereof is excellent when the resulting composition is used as a resist ink.

Furthermore, it is preferable that a polymerization inhibitor be used in the reaction of Step 1 in order to prevent gelation during the reaction. Examples of the polymerization inhibitor include hydroquinone, methyl hydroquinone, tert-butyl hydroquinone, methoquinone, toluhydroquinone, toluquinone, 1,4-naphthoquinone, phenothiazine, di-tert-butyl-hydroxytoluene, and an aluminum salt of N-nitrosophenylhydroxyamine.

In Step 1, the reaction temperature can be selected within a range of 60° C. to 130° C., irrespective of timing of adding an esterification catalyst thereto. Particularly, it is preferable that side-reactions occurred in an earlier stage of the reaction be inhibited as much as possible in order to suppress an increase in the viscosity of the obtained reaction product. Hence, it is preferable that the reaction temperature be within a relatively low temperature range of 60° C. to 110° C. Additionally, the total reaction time of Step 1 is preferably within a range of 5 to 40 hours although it varies depending on the scale.

In Step 1, the esterification catalyst may be added at once during the reaction of the aromatic epoxy resin (a1) and the radically-polymerizable unsaturated double bond-containing monocarboxylic acid (a2). However, a method in which a part of the esterification catalyst is added to make the reaction proceed, and then, the esterification catalyst is further added stepwise is preferable since the side reactions can be not only inhibited, but also the reaction time can be shortened. The amount of the catalyst to be used in the first addition and second addition is not particularly limited. However, it is preferable that 50 to 90% by weight of the total amount of the catalyst be added in the first addition, and the remaining catalyst be then added in the second addition.

Next, a polybasic anhydride (a3) is reacted with the obtained epoxy vinyl ester resin (v1) to obtain an acid group-containing vinyl ester resin (v2) having an acid group bonded in a pendant form (Step 2).

In this case, the number of moles of the polybasic anhydride (a3) reacted therein is not particularly limited. However, the number of moles thereof is preferably within a range where 0.75 to 1.0 mole of acid anhydride groups of the polybasic anhydride (a3) present with respect to 1.0 mole of secondary hydroxyl groups of the epoxy vinyl ester resin (v1) because gelation can be prevented during the reaction.

In Step 2, if the polybasic anhydride (a3) remains in the system after completion of the reaction, gelation may occur during the subsequent preparation steps or when a final product thereof is produced. Hence, it is necessary to make the reaction sufficiently proceed in Step 2. Therefore, the reaction temperature is preferably within a range of 60 to 130° C., and the reaction time is preferably within a range of 1 to 10 hours.

Next, an epoxy group-containing radically-polymerizable unsaturated monomer (a2) is reacted with a carboxyl group in the acid group-containing vinyl ester resin (v2) to obtain a vinyl ester compound (v3) that radically-polymerizable unsaturated groups are further introduced into (Step 3).

At this time, the reaction is preferably conducted such that 0.75 to 1.0 mole of the epoxy group-containing radically-polymerizable unsaturated monomer (a2) is charged with respect to 1.0 mole of 2-oxypropylene groups bonded to the aromatic ring in the acid group-containing vinyl ester resin (v2). In addition, if a bisphenol-type compound represented by the general formula (3) is used as the acid group-containing vinyl ester resin (v2), it is preferable to perform the reaction using 0.8 to 1.0 mole of the epoxy group-containing radically-polymerizable unsaturated monomer (a2), based on 1.0 mole of 2-oxypropylene groups bonded to the aromatic ring in the acid group-containing vinyl ester resin (v2).

In this reaction, the reaction temperature is preferably within a range of 90 to 130° C., and the reaction time is preferably within a range of 1 to 10 hours.

Next, a polybasic anhydride (a3) is further reacted with secondary hydroxyl groups in the vinyl ester resin (v3) obtained in the process 3 whereby an objective acid group-containing vinyl ester resin (A) can be obtained (Step 4). In this reaction, it is preferable to perform a reaction using 0.1 to 0.9 mole f the polybasic anhydride (a3), based on 1 mole of 2-oxypropylene groups bonded to the aromatic ring in the vinyl ester resin (v3). Additionally, in this reaction, the reaction temperature is not particularly limited, but it is preferably within a range of 90 to 130° C., and the reaction time is preferably within a range of 1 to 10 hours.

In the present invention, via Steps 3 and 4, and by further repeating these reactions of the steps, a molecular structure in which the polybasic anhydride (a3) and the epoxy group-containing radically-polymerizable unsaturated monomer (a4) are alternately reacted is formed.

Furthermore, as described above, if tetrahydrophthalic anhydride or hexahydrophthalic anhydride is used as the polybasic anhydride (a3) in Step 2, and succinic anhydride is used as the polybasic anhydride (a3) in Step 4, not only is it possible to impart excellent solvent-solubility to the acid group-containing vinyl ester resin (A), but an acid group derived from succinic anhydride is also present at a terminal of the multi-step-wise molecular structure, thereby providing remarkable improvement in the heat control range or alkali developability.

Method 1 as specifically described above is preferable because the reaction can be easily controlled, and the possibility of the design of a polymer structure can be expanded.

On the other hand, Method 2 is a method in which the epoxy vinyl ester resin (v1) obtained in Step 1 of Method 1, the epoxy group-containing radically-polymerizable unsaturated monomer (a2), and the polybasic anhydride (a3) are simultaneously added and reacted. Method 2 is preferable since a third or more generation of double bonds can be easily introduced into the acid group-containing vinyl ester resin structure.

With regard to the reaction ratio between the epoxy vinyl ester resin (v1), the epoxy group-containing radically-polymerizable unsaturated monomer (a2), and the polybasic anhydride (a3) in Method 2, specifically, it is preferable that 0.75 to 2.5 moles of the epoxy group-containing radically-polymerizable unsaturated monomers (a2), and 0.75 to 3.5 moles of acid anhydride groups in the polybasic anhydride (a3) be used with respect to 1.0 mole of the secondary hydroxyl groups in the epoxy vinyl ester resin (v1). In addition, if a bisphenol-type compound is used as the acid group-containing vinyl ester resin (v1), it is preferable that 0.8 to 1.0 mole of the compound be used with respect to 1.0 mole of 2-oxypropylene groups bonded to the aromatic ring in the epoxy vinyl ester resin (v1).

Moreover, from the viewpoint of alkali developability, a resin obtained by reacting the components at the ratio where a value obtained by subtracting the number of moles of the radically-polymerizable unsaturated double bond-containing monoepoxy compound (a4), based on 1.0 mole of the secondary hydroxyl groups in the epoxy vinyl ester resin (v1), from the number of moles of the acid anhydride group of the polybasic anhydride (a3), based on 1.0 mole of the secondary hydroxyl groups in the epoxy vinyl ester resin (v1), is 0.4 to 0.95 is preferred.

In this case, the reaction temperature is not particularly limited, but it is preferably within a range of 90 to 130° C., and the reaction time is preferably within a range of 4 to 24 hours.

Furthermore, for example, the following method may be adopted other than Method 1 or 2 in the present invention. In this method, predetermined amounts of the polybasic anhydride (a3) and the epoxy group-containing radically-polymerizable unsaturated monomer (a2) are simultaneously added to the acid group-containing vinyl ester resin (v2) obtained via Steps 1 and 2 as described above, thereby reacting these compounds. In this case, it is preferable that the polybasic anhydride (a3) be used such that 1.0 to 4.0 moles of the acid anhydride groups of the polybasic anhydride (a3) are present with respect to 1 mole of the 2-oxypropylene groups bonded to the aromatic ring in the acid group-containing vinyl ester resin (v2). On the other hand, it is preferable that the epoxy group-containing radically-polymerizable unsaturated monomer (a2) be used such that 0.75 to 2.5 moles of the acid anhydride groups are present with respect to 1 mole of the 2-oxypropylene groups. This is because sensitivity or developability thereof can be improved. Additionally, in terms of developability, it is preferable to react the components at a ratio where a value obtained by subtracting the number of moles of the radically-polymerizable unsaturated double bond-containing monoepoxy compound (a4) from the number of moles of the acid anhydride group of the polybasic anhydride (a3), based on 1 mole of the 2-oxypropylene groups, is 0.4 to 0.95.

In the acid group-containing vinyl ester resin (A) synthesized in the above-described manner, a multiplicity of the radically-polymerizable unsaturated double bonds derived from the epoxy group-containing radically-polymerizable unsaturated monomer (a4) are present at the termini of the molecule, and as a result, high sensitivity to actinic energy rays will be obtained in terms of the steric structure. Furthermore, a resin having such a structure has a high content of the acid groups bonded in the pendant form, compared to a conventional epoxy vinyl ester resin, and the concentration of chlorine ions derived from an aromatic epoxy resin will be relatively low, thereby providing excellent insulating reliability upon a durability test, etc.

Next, examples of the photopolymerization initiator (B) used in the present invention include acetophenones such as acetophenone, 2,2-diethoxy-2-phenylacetophenone, p-dimethylaminopropiophenone, dichloroacetophenone, 2-methyl-1-[4-(methylthio)phenyl]-2-morpholinopropan-1-one, and 2-benzyl-2-dimethylamino-1-(4-morpholinophenyl)-butanone-1; benzophenones such as benzophenone, 2-chlorobenzophenone, p,p-bisdiethylaminobenzophenone, p,p-bisdiethylaminobenzophenone, and 4-benzoyl-4'-methyl diphenyl sulfide; benzoin ethers such as benzyl, benzoin, benzoin methyl ether, and benzoin isobutyl ether; ketals such as benzyl dimethyl ketal; thioxanthones such as thioxanthone, 2-chlorothioxanthone, 2,4-diethylthioxanthone, and 2-isopropylthioxanthone; anthraquinones; dimers of 2,4,5-triarylimidazole; 2,4,6-tris-S-triazine; and 2,4,6-trimethyl benzoyl diphenyl phosphine oxide. Among these, 2-methyl-1-[4-(methylthio)phenyl]-2-morpholinopropan-1-one and 2-benzyl-2-dimethyl amino-1-(4-morpholinophenyl)-butanone-1 are preferred due to their high reactivity. These photopolymerization initiators (B) can be used alone, or two or more kinds thereof can be used in combination.

In general, the blending amount of the photopolymerization initiator (B) is preferably within a range of 0.5 to 50 parts by weight, based on 100 parts by weight of the acid group-containing vinyl ester resin (A). That is, if the amount is 0.5 parts by weight or more, the photo-curing reaction of the acid group-containing vinyl ester resin (A) will sufficiently proceeds. If the amount is 50 parts by weight or less, the mechanical properties of the cured product will be improved. It is more preferable that the amount of the photopolymerization initiator (B) be within a range of 2 to 30 parts by weight, based on 100 parts by weight of the acid group-containing vinyl ester resin (A), due to excellent sensitivity to actinic energy rays, mechanical properties of the cured product, and the like.

The photosensitive resin composition of the present invention may contain a thermally reactive curing agent (C), and a diluent (D). In particular, when the composition is used as a resin composition for a resist ink, it is preferable that the composition contain a thermally reactive curing agent (C) and a diluent (D).

Examples of the thermally reactive curing agent (C) include an epoxy resin, or an amino resin such as a butoxylated melamine resin, a methoxylated melamine resin, and a benzoguanamine-based co-condensed resin. Among these, an epoxy resin is particularly preferred due to its good heat resistance and solvent resistance after thermal curing. Examples of the epoxy resin include a bisphenol A-type epoxy resin, a bisphenol F-type epoxy resin, a phenol novolak-type epoxy resin, a cresol novolak-type epoxy resin, an alicyclic epoxy resin, a trisphenolmethane-type epoxy resin, a rubber-modified epoxy resin, tris(2,3-epoxypropyl) isocyanurate, diphenyl diglycidyl ether, tetramethyl diphenyl diglycidyl ether, and an epoxy resin containing an oxazolidone ring.

Among these, a cresol novolak-type epoxy resin or an epoxy resin containing an oxazolidone ring are preferred since they provide excellent heat control range or heat resistance of the cured product after thermal curing when the resulting composition is used as a resist ink. On the other hand, it is preferable to use a bisphenol A-type epoxy resin or tris(2,3-epoxy propyl)isocyanurate because excellent sensitivity and reactivity can be obtained when the resulting composition is used as a resist ink. Theses resins can be used alone, or two or more kinds thereof can be used in combination, depending on its application.

The epoxy resin containing an oxazolidone ring is not particularly limited to specific types. However, examples thereof include an epoxy resin obtained by reacting a polyfunctional epoxy resin with an aromatic monoisocyanate.

Furthermore, if the epoxy resin is used as the thermally reactive curing agent (C), it is preferable to use a curing accelerator in combination. Examples of the curing accelerator include various curing accelerators for epoxy resins, such as a melamine derivative, an imidazole derivative, dicyanamide, and a phenol derivative.

The blending amount of the thermally reactive curing agent (C) is preferably within a range of 5 to 40 parts by weight, based on 100 parts by weight of the acid group-containing vinyl ester resin (A). That is, if it is used in an amount of no less than 5 parts by weight, a cured product consequently obtained therefrom is excellent in various properties such as heat resistance, solvent resistance, acid resistance, and adhesiveness of are excellent, and has sufficient performances for electrical characteristics such as electrical insulating resistance. On the other hand, if the amount is no more than 40 parts by weight, sensitivity to an actinic energy ray is excellent, and photosensitivity and developability are excellent when the resulting composition is used as a resist ink.

The diluent (D) is not particularly limited, but examples thereof include ketones such as ethyl methyl ketone and cyclohexanone; aromatic hydrocarbons such as toluene, xylene, and tetramethylbenzene; glycol ethers such as methyl cellosolve, butyl cellosolve, methyl carbitol, butyl carbitol, propyleneglycol monomethyl ether, dipropyleneglycol monoethyl ether, and dipropylene glycol diethyl ether; esters such as ethyl acetate, butyl acetate, butyl cellosolve acetate, propylene glycol monomethyl ether acetate, and diethylene glycol monoethyl ether acetate; alcohols such as ethanol, propanol, ethylene glycol, and propylene glycol; aliphatic hydrocarbons such as octane and decane; organic solvents including petroleum-based solvents such as petroleum ether, petroleum naphtha, hydrogenated petroleum naphtha and solvent naphtha; photopolymerizable reactive diluents which, for example, includes polyols such as 2-hydroxyethyl(meth)acrylate, 2-hydroxypropyl(meth)acrylate, N-vinyl pyrrolidone, N-vinyl caprolactam, acryloyl morpholine, methoxytetraethylene glycol (meth)acrylate, methoxypolyethylene glycol (meth)acrylate, polyethylene glycol di(meth)acrylate, N,N-dimethylacrylamide, melamine(meth)acrylate, diethylene glycol di(meth)acrylate, triethylene glycol di(meth)acrylate, propylene glycol di(meth)acrylate, tripropylene glycol di(meth)acrylate, glycerine diglycidyl ether di(meth)acrylate, isobornyl(meth)acrylate, hexanediol, trimethylolpropane, pentaerythritol trimethylolpropane, dipentaerythritol, and tris-hydroxyethyl isocyanurate, or polyhydric (meth)acrylates such as an ethylene-oxide or propylene-oxide adduct thereof. Among these, it is preferable to use an ester alone, or an ester and a petroleum-based solvent in combination because smoothness after predrying can be improved when the resulting composition is used as a resist ink, and it is further preferable to use these in combination with a photopolymerizable reactive diluent. Among the esters, it is preferable to use propylene glycol monomethyl ether acetate, or diethylene glycol monoethyl ether acetate.

The diluents (D) can be used alone, or two or more kinds thereof can be used in combination. The blending amount thereof is preferably within a range of 30 to 300 parts by weight, and particularly preferably within a range of 50 to 200 parts by weight, based on 100 parts by weight of the acid group-containing vinyl ester resin (A).

In order to prepare the photosensitive resin composition of the present invention as a resin composition for a resist ink, the acid group-containing vinyl ester resin (A), the photopolymerization initiator (B), the thermally reactive curing agent (C), and the diluent (D) are mixed, where a 3-roll or a planetary stirrer can be used to uniformly mix them, thereby obtaining the photosensitive resin composition.

Here, the blending amount of the acid group-containing vinyl ester resin (A) is not particularly limited, but it is preferably within a range of 10 to 70% by weight, and particularly preferably within a range of 30 to 60% by weight in the composition of a resist ink. This is because such ranges provide remarkable improvement in sensitivity of the resist ink, and further provide excellent drying property after predrying as well as excellent heat and solvent resistance of the coating film obtained after thermal curing.

For the photosensitive resin composition of the present invention, the following pigments, fillers, additives, or the like, as conventionally used in the art, can be used. For example, the photosensitive resin composition can contain organic pigments such as a quinacridone pigment, an azo pigment, and a phthalocyanine pigment; inorganic pigments such as titanium oxide, a metal foil-like pigment, and a rust-preventive pigment; fillers such as barium sulfate, calcium carbonate, spherical fused silica, pulverized fused silica, crystalline silica, alumina, silicon nitride, aluminum hydroxide, carbon black, talc, and clay; UV absorbers such as a hindered amine UV absorber, a benzotriazole UV absorber, and a benzophenone UV absorber; antioxidants such as a hindered phenol antioxidant, a phosphorus antioxidant, a sulfur antioxidant, and a hydrazide antioxidant; coupling agents such as a silane coupling agent and a titanium coupling agent; leveling agents such as a fluorine-based surfactant; a rheology controller such as Aerosil; a pigment dispersant; a cissing inhibitor; and additives such as an antifoaming agent. Furthermore, if necessary, the photosensitive resin composition can contain reinforcing materials such as glass fiber, glass cloth, and carbon fiber. In addition, if necessary, the photosensitive resin composition can contain a flame retardancy imparting agent. As the flame retardancy imparting agent, various materials can be used, and examples thereof include a halogen compound such as decabromodiphenyl ether and tetrabromobisphenol A; a phosphorous atom-containing compound such as red phosphorous and various phosphate ester compounds; a nitrogen atom-containing compound such as melamine or a derivative thereof; inorganic flame retardant compounds such as aluminum hydroxide, magnesium hydroxide, zinc borate, and calcium borate.

An actinic energy ray such as UV and electron beam can be irradiated onto the obtained photosensitive resin composition to obtain the cured product thereof. The utilizations or applications of the cured product are not limited at all. Particularly, if the composition is used as a resin composition for a resist ink, the composition is applied onto a print base board, for example, by a screen printing method, a curtain coat method, a roll coat method, a spin coat method, a deep coat method, or the like to a thickness of 10 to 150 μm (thickness of the liquid film), and then predried at 60 to 90° C. for 15 to 90 minutes to remove volatile components such as organic solvents (application and predrying processes may be repeated several times). Then, a negative film with a desired mask pattern is adhered onto the dried coating film, and the film was irradiated with a radioactive ray such as UV and electron beam to perform exposure (alternatively, a laser beam, etc. may be used to directly expose the pattern thereto, and in this case, such a mask pattern is not required). Then, the film is subjected to development using a diluted aqueous alkali solution as a developer to remove the coating film on the unexposed area while the coating film on the exposed is not removed because it is thus photo-cured whereby a pattern can be formed. As the diluted aqueous alkali solution, a 0.5 to 5 wt % aqueous sodium carbonate solution or aqueous sodium hydroxide solution is generally used, but other alkali solutions may be used. Then, thermal curing can be performed at 130° C. to 160° C. for 20 to 90 minutes using a hot air dryer to obtain a cured coating film having excellent heat resistance, solvent resistance, and the like.

The above-described resin composition is preferably used, for example, for a solder resist on a circuit board such as a print wiring board, an interlayer insulating layer, a resist material for a liquid crystal color filter, an overcoat, a spacer for liquid crystal, a pigment resist for a color filter, a resist for a black matrix, and the like.

EXAMPLES

Hereinbelow, the present invention will be described in detail with reference to Examples. In Examples, parts and percentages are by weight unless otherwise specified.

The numbers of radically-polymerizable unsaturated double bonds with respect to 1 mole of the acid group-containing vinyl ester resin (A) shown in the following Examples and Tables are values calculated from the total number of the aromatic rings in the aromatic epoxy resin (a1), and the numbers of moles of the unsaturated monobasic acids and the epoxy group-containing unsaturated monomers charged thereto. Furthermore, with regard to the number of the radically-polymerizable unsaturated double bonds, a number average molecular weight as determined by the following GPC measurement, a measured value of the equivalents of the double bonds, and the like can be used to determine the number of the radically-polymerizable unsaturated double bonds with respect to one molecule of the acid group-containing vinyl ester resin (A).

The analysis conditions for gel permeation chromatography (GPC) upon measurement of a number average molecular weight are as follows.

GPC device: HLC-8220 (manufactured by Tosoh Corporation)

Column: TSG-GUARD COLUMN+TSG-GEL G2000HXL×2+TSG-GEL G3000HXL+TSG-GEL G4000HXL (all manufactured by Tosoh Corporation)

Solvent: Tetrahydrofuran 1 ml/min

Detector: RI detector

Example 1

Preparation of a Resin Solution (A-1) Including an Acid Group-Containing Vinyl Ester Resin (A)

To 1923 g of diethylene glycol monoethyl ether acetate, 2140 g of an ortho-cresol novolak-type epoxy resin ["EPICLON N-695" manufactured by Dainippon Ink and Chemicals, Inc., softening point: 95° C., epoxy equivalent: 214, average number of functional groups: 7.6] (number of the glycidyl groups (total number of the aromatic rings): 10.0 moles), 720 g (10.0 moles) of acrylic acid, and 2.9 g of hydroquinone were added, and the mixture was heated while stirring to 100° C. for uniform dissolution. After that, 8.6 g of triphenyl phosphine were added thereto, and the mixture was heated to 110° C. to perform a reaction for 2 hours, and then, 2.3 g of triphenyl phosphine was further added to the mixture. The temperature of the mixture was elevated to 120° C. to perform a reaction for 12 hours. To the obtained reaction solution, 1923 g of an aromatic hydrocarbon ("SolvEsso 150") and 1368 g (9.0 moles) of tetrahydrophthalic anhydride were added to perform a reaction at 110° C. for 4 hours.

In addition, to the obtained reaction solution, 1136 g (8.0 moles) of glycidyl methacrylate were added to perform a reaction at 115° C. for 4 hours. After that, to the obtained reaction solution, 912 g (6.0 moles) of tetrahydrophthalic anhydride were added to perform a reaction at 115° C. for 4 hours, thereby obtaining a resin solution having an acid value of the solid content of 70 mgKOH/g and a solid content of 62%, which was designated as resin solution A-1.

Example 2

Preparation of a Resin Solution (A-2) Including an Acid Group-Containing Vinyl Ester Resin (A)

To 197 g of diethylene glycol monoethyl ether acetate, 214 g of an ortho-cresol novolak-type epoxy resin "EPICLON N-695" (number of the glycidyl groups (total number of the aromatic rings): 1.0 mole), 72 g (1.0 mole) of acrylic acid, and 0.29 g of hydroquinone were added, and the mixture was heated while stirring to 100° C. for uniform dissolution. After that, 0.86 g of triphenyl phosphine were added thereto, and the mixture was heated to 110° C. to perform a reaction for 2 hours, and then, 0.23 g of triphenyl phosphine was further added to the mixture. The temperature of the mixture was elevated to 120° C. to perform a reaction for 12 hours. To the obtained reaction solution, 197 g of "SolvEsso 150" and 144 g (0.95 mole) of tetrahydrophthalic anhydride were added to perform a reaction at 110° C. for 4 hours. Furthermore, to the obtained reaction solution, 121 g (0.85 moles) of glycidyl methacrylate were added to perform a reaction at 115° C. for 4 hours. After that, to the obtained reaction solution, 91.2 g (0.6 mole) of tetrahydrophthalic anhydride were added to perform a reaction at 115° C. for 4 hours, thereby obtaining a resin solution having an acid value of the solid content of 64 mgKOH/g and a solid content of 62%, which was designated as resin solution A-2.

Example 3

Preparation of a Resin Solution (A-3) Including an Acid Group-Containing Vinyl Ester Resin (A)

To 213 g of diethylene glycol monoethyl ether acetate, 214 g of an ortho-cresol novolak-type epoxy resin "EPICLON N-695" (number of the glycidyl groups (total number of the aromatic rings): 1.0 mole), 72 g (1.0 mole) of acrylic acid, and 0.29 g of hydroquinone were added, and the mixture was heated while stirring to 100° C. for uniform dissolution. After that, 0.86 g of triphenyl phosphine were added thereto, and the mixture was heated to 110° C. to perform a reaction for 2 hours, and then, 0.23 g of triphenyl phosphine were further added to the mixture. The temperature of the mixture was elevated to 120° C. to perform a reaction for 12 hours. To the obtained reaction solution, 213 g of "SolvEsso 150", 274 g (1.8 moles) of tetrahydrophthalic anhydride and 135 g (0.95 mole) of glycidyl methacrylate were added to perform a reaction at 115° C. for 8 hours, thereby obtaining a resin solution having an acid value of the solid content of 71 mgKOH/g and a solid content of 62%, which was designated as resin solution A-3.

Example 4

Preparation of a Resin Solution (A-4) Including an Acid Group-Containing Vinyl Ester Resin (A)

To 258 g of diethylene glycol monoethyl ether acetate, 214 g of an ortho-cresol novolak-type epoxy resin "EPICLON N-695" (number of the glycidyl groups (total number of the aromatic rings): 1.0 mole), 72 g (1.0 mole) of acrylic acid, and 0.29 g of hydroquinone were added, and the mixture was heated while stirring to 100° C. for uniform dissolution. After that, 0.86 g of triphenyl phosphine were added thereto, and the mixture was heated to 110° C. to perform a reaction for 2 hours, and then, 0.23 g of triphenyl phosphine were further added to the mixture. The temperature of the mixture was elevated to 120° C. to perform a reaction for 12 hours. To the obtained reaction solution, 258 g of "SolvEsso 150", 357 g (2.35 moles) of tetrahydrophthalic anhydride, and 199 g (1.4 moles) of glycidyl methacrylate were added to perform a reaction at 115° C. for 8 hours, thereby obtaining a resin solution having an acid value of the solid content of 65 mgKOH/g and a solid content of 62%, which was designated as resin solution A-4.

Example 5

Preparation of a Resin Solution (A-5) Including an Acid Group-Containing Vinyl Ester Resin (A)

To 1828 g of diethylene glycol monoethyl ether acetate, 2140 g of an ortho-cresol novolak-type epoxy resin "EPICLON N-695" (number of the glycidyl groups (total number of the aromatic rings): 10.0 moles), 720 g (10.0 moles) of acrylic acid, and 2.9 g of hydroquinone were added, and the mixture was heated while stirring to 100° C. for uniform dissolution. After that, 8.6 g of triphenyl phosphine were added thereto, and the mixture was heated to 110° C. to perform a reaction for 2 hours, and then, 2.3 g of triphenyl phosphine were further added to the mixture. The temperature of the mixture was elevated to 120° C. to perform a reaction for 12 hours. To the obtained reaction solution, 1828 g of "SolvEsso 150" and 1368 g (9.0 moles) of tetrahydrophthalic anhydride were added to perform a reaction at 110° C. for 4 hours. Furthermore, to the obtained reaction solution, 1136 g (8.0 moles) of glycidyl methacrylate were added to perform a reaction at 115° C. for 4 hours. After that, to the obtained reaction solution, 600 g (6.0 moles) of succinic anhydride were added to perform a reaction at 115° C. for 4 hours, thereby obtaining a resin solution having an acid value of the solid content of 71 mgKOH/g and a solid content of 62%, which was designated as resin solution A-5.

Example 6

Preparation of a Resin Solution (A-6) Including an Acid Group-Containing Vinyl Ester Resin (A)

To 186 g of diethylene glycol monoethyl ether acetate, 214 g of an ortho-cresol novolak-type epoxy resin "EPICLON N-695" (number of the glycidyl groups (total number of the aromatic rings): 1.0 mole), 72 g (1.0 mole) of acrylic acid, and 0.29 g of hydroquinone were added, and the mixture was heated while stirring to 100° C. for uniform dissolution. After that, 0.86 g of triphenyl phosphine were added thereto, and the mixture was heated to 110° C. to perform a reaction for 2 hours, and then, 0.23 g of triphenyl phosphine were further added to the mixture. The temperature of the mixture was elevated to 120° C. to perform a reaction for 12 hours. To the obtained reaction solution, 186 g of "SolvEsso 150" and 137 g (0.9 mole) of tetrahydrophthalic anhydride were added to perform a reaction at 110° C. for 4 hours. Furthermore, to the obtained reaction solution, 121 g (0.85 moles) of glycidyl methacrylate were added to perform a reaction at 115° C. for 4 hours. After that, to the obtained reaction solution, 65.0 g (0.65 mole) of succinic anhydride were added to perform a reaction at 115° C. for 4 hours, thereby obtaining a resin solution having an acid value of the solid content of 67 mgKOH/g and a solid content of 62%, which was designated as resin solution A-6.

Example 7

Preparation of a Resin Solution (A-7) Including an Acid Group-Containing Vinyl Ester Resin (A)

To 200 g of diethylene glycol monoethyl ether acetate, 214 g of an ortho-cresol novolak-type epoxy resin "EPICLON N-695" (number of the glycidyl groups (total number of the aromatic rings): 1.0 mole), 72 g (1.0 mole) of acrylic acid, and 0.29 g of hydroquinone were added, and the mixture was heated while stirring to 100° C. for uniform dissolution. After that, 0.86 g of triphenyl phosphine were added thereto, and the mixture was heated to 110° C. to perform a reaction for 2 hours, and then, 0.23 g of triphenyl phosphine were further added to the mixture. The temperature of the mixture was elevated to 120° C. to perform a reaction for 12 hours. To the obtained reaction solution, 200 g of "SolvEsso 150", 152 g (1.0 mole) of tetrahydrophthalic anhydride, 80.0 g (0.8 mole) of succinic anhydride, and 135 g (0.95 mole) of glycidyl methacrylate were added to perform a reaction at 115° C. for 8 hours, thereby obtaining a resin solution having an acid value of the solid content of 76 mgKOH/g and a solid content of 62%, which was designated as resin solution A-7.

Example 8

Preparation of a Resin Solution (A-8) Including an Acid Group-Containing Vinyl Ester Resin (A)

To 243 g of diethylene glycol monoethyl ether acetate, 214 g of an ortho-cresol novolak-type epoxy resin "EPICLON N-695" (number of the glycidyl groups (total number of the aromatic rings): 1.0 mole), 72 g (1.0 mole) of acrylic acid, and 0.29 g of hydroquinone were added, and the mixture was heated while stirring to 100° C. for uniform dissolution. After that, 0.86 g of triphenyl phosphine were added thereto, and the mixture was heated to 110° C. to perform a reaction for 2 hours, and then, 0.23 g of triphenyl phosphine were further added to the mixture. The temperature of the mixture was elevated to 120° C. to perform a reaction for 12 hours. To the obtained reaction solution, 243 g of "SolvEsso 150", 213 g (1.4 moles) of tetrahydrophthalic anhydride, 95.0 g (0.95 mole) of succinic anhydride, and 199 g (1.4 moles) of glycidyl methacrylate were added to perform a reaction at 115° C. for 8 hours, thereby obtaining a resin solution having an acid value of the solid content of 69 mgKOH/g and a solid content of 62%, which was designated as resin solution A-8.

TABLE 1

| | | Example No. | | | | | | | |
|---|---|---|---|---|---|---|---|---|---|
| | | 1 | 2 | 3 | 4 | 5 | 6 | 7 | 8 |
| Resin solution | | A-1 | A-2 | A-3 | A-4 | A-5 | A-6 | A-7 | A-8 |
| Composition | N695 | 1 | 1 | 1 | 1 | 1 | 1 | 1 | 1 |
| of raw | AA | 1 | 1 | 1 | 1 | 1 | 1 | 1 | 1 |
| materials | M5300 | — | — | — | — | — | — | — | — |
| | THPA1 | 0.9 | 0.9 | 1.8 | 2.35 | 0.9 | 0.9 | 1.0 | 1.4 |
| | GMA | 0.8 | 0.85 | 0.95 | 1.4 | 0.8 | 0.85 | 0.95 | 1.4 |
| | THPA2 | 0.6 | 0.65 | — | — | — | — | — | — |
| | SA | — | — | — | — | 0.6 | 0.65 | 0.8 | 0.95 |
| DBeq | | 1.8 | 1.85 | 1.95 | 2.4 | 1.8 | 1.85 | 1.95 | 2.4 |
| Generation No. of double bonds | | 2 | 2 | 2 | 3 | 2 | 2 | 2 | 3 |
| Synthesis method | | Sequential | Sequential | Simultaneous | Simultaneous | Sequential | Sequential | Simultaneous | Simultaneous |
| Acid value | | 70 | 64 | 71 | 65 | 71 | 67 | 76 | 69 |

(The compositions of raw materials shown in Table 1 are expressed in molar ratios, and each of the abbreviations indicates as follows:

N695: Ortho-cresol novolak-type epoxy resin ["EPICLON N-695" manufactured by Dainippon Ink and Chemicals, Inc., softening point 95° C., epoxy equivalent 214, average number of functional groups 7.6]

AA: Acrylic acid

M5300: ε-caprolactone 2 mol-modified acrylic acid ["ARONIX M-5300" manufactured by Toa Synthetic Chemical Co., Ltd., molecular weight 300]

THPA1: Tetrahydrophthalic anhydride used in Step 1 or Method 2

GMA: Glycidyl methacrylate

SA: Succinic anhydride

THPA2: Tetrahydrophthalic anhydride used in Step 4

DBeq: Number of the radically-polymerizable unsaturated double bonds per aromatic ring Generation No. of double bonds: Generation No. of the radically-polymerizable unsaturated double bonds)

Example 9

Preparation of a Resin Solution (A-9) Including an Acid Group-Containing Vinyl Ester Resin (A)

To 2063 g of diethylene glycol monoethyl ether acetate, 2140 g of an ortho-cresol novolak-type epoxy resin "EPICLON N-695" (number of the glycidyl groups (total number of the aromatic rings): 10.0 moles), 600 g (2.0 moles) of ε-caprolactone 2 mol-modified acrylic acid ["ARONIX M-5300" manufactured by Toa Synthetic Chemical Co., Ltd., molecular weight 300], 576 g (8.0 moles) of acrylic acid, and 3.3 g of hydroquinone were added, and the mixture was heated while stirring to 100° C. for uniform dissolution. After that, 10.0 g of triphenyl phosphine were added thereto, and the mixture was heated to 110° C. to perform a reaction for 2 hours, and then 2.7 g of triphenyl phosphine were further added to the mixture. The temperature of the mixture was elevated to 120° C. to perform a reaction for 12 hours. To the obtained reaction solution, 2063 g of an aromatic hydrocarbon ("SolvEsso 150") and 1368 g (9.0 moles) of tetrahydrophthalic anhydride were added to perform a reaction at 110° C. for 4 hours. Furthermore, to the obtained reaction solution, 1136 g (8.0 moles) of glycidyl methacrylate were added to perform a reaction at 115° C. for 4 hours. After that, to the obtained reaction solution, 912 g (6.0 moles) of tetrahydrophthalic anhydride were added to perform a reaction at 115° C. for 4 hours, thereby obtaining a resin solution having an acid value of the solid content of 63 mgKOH/g and a solid content of 62%, which was designated as resin solution A-9.

Example 10

Preparation of a Resin Solution (A-10) Including an Acid Group-Containing Vinyl Ester Resin (A)

To 211 g of diethylene glycol monoethyl ether acetate, 214 g of an ortho-cresol novolak-type epoxy resin "EPICLON N-695" (number of the glycidyl groups (total number of the aromatic rings): 1.0 mole), 60.0 g (0.2 mole) of ε-caprolactone 2 mol-modified acrylic acid, 57.6 g (0.8 mole) of acrylic acid, and 0.33 g of hydroquinone were added, and the mixture was heated while stirring to 100° C. for uniform dissolution. After that, 1.0 g of triphenyl phosphine were added thereto, and the mixture was heated to 110° C. to perform a reaction for 2 hours, and then, 0.27 g of triphenyl phosphine were further added to the mixture. The temperature of the mixture was elevated to 120° C. to perform a reaction for 12 hours. To the obtained reaction solution, 211 g of "SolvEsso 150", and 144 g (0.95 mole) of tetrahydrophthalic anhydride were added to perform a reaction at 110° C. for 4 hours. Furthermore, to the obtained reaction solution, 121 g (0.85 moles) of glycidyl methacrylate were added to perform a reaction at 115° C. for 4 hours. After that, to the obtained reaction solution, 91.2 g (0.6 mole) of tetrahydrophthalic anhydride were added to perform a reaction at 115° C. for 4 hours, thereby obtaining a resin solution having an acid value of the solid content of 60 mgKOH/g and a solid content of 62%, which was designated as resin solution A-10.

Example 11

Preparation of a Resin Solution (A-11) Including an Acid Group-Containing Vinyl Ester Resin (A)

To 227 g of diethylene glycol monoethyl ether acetate, 214 g of an ortho-cresol novolak-type epoxy resin "EPICLON N-695" (number of the glycidyl groups (total number of the aromatic rings): 1.0 mole), 60.0 g (0.2 mole) of ε-caprolactone 2 mol-modified acrylic acid, 57.6 g (0.8 mole) of acrylic acid, and 0.33 g of hydroquinone were added, and the mixture was heated while stirring to 100° C. for uniform dissolution. After that, 1.0 g of triphenyl phosphine were added thereto, and the mixture was heated to 110° C. to perform a reaction for 2 hours, and then, 0.27 g of triphenyl phosphine were further added to the mixture. The temperature of the mixture was elevated to 120° C. to perform a reaction for 12 hours. To the obtained reaction solution, 227 g of "SolvEsso 150", 274 g (1.8 moles) of tetrahydrophthalic anhydride, and 135 g (0.95 mole) of glycidyl methacrylate were added to perform a reaction at 115° C. for 8 hours, thereby obtaining a resin solution having an acid value of the solid content of 67 mgKOH/g and a solid content of 62%, which was designated as resin solution A-11.

Example 12

Preparation of a Resin Solution (A-12) Including an Acid Group-Containing Vinyl Ester Resin (A)

To 272 g of diethylene glycol monoethyl ether acetate, 214 g of an ortho-cresol novolak-type epoxy resin "EPICLON N-695" (number of the glycidyl groups (total number of the aromatic rings): 1.0 mole), 60.0 g (0.2 mole) of ε-caprolactone 2 mol-modified acrylic acid, 57.6 g (0.8 mole) of acrylic acid, and 0.33 g of hydroquinone were added, and the mixture was heated while stirring to 100° C. for uniform dissolution. After that, 1.0 g of triphenyl phosphine were added thereto, and the mixture was heated to 110° C. to perform a reaction for 2 hours, and then, 0.27 g of triphenyl phosphine were further added to the mixture. The temperature of the mixture was elevated to 120° C. to perform a reaction for 12 hours. To the obtained reaction solution, 272 g of "SolvEsso 150", 357 g (2.35 moles) of tetrahydrophthalic anhydride, and 199 g (1.4 moles) of glycidyl methacrylate were added to perform a reaction at 115° C. for 8 hours, thereby obtaining a resin solution having an acid value of the solid content of 62 mgKOH/g and a solid content of 62%, which was designated as resin solution A-12.

Example 13

Preparation of a Resin Solution (A-13) Including an Acid Group-Containing Vinyl Ester Resin (A)

To 1967 g of diethylene glycol monoethyl ether acetate, 2140 g of an ortho-cresol novolak-type epoxy resin "EPI-CLON N-695" (number of the glycidyl groups (total number of the aromatic rings): 10.0 moles), 600 g (2.0 moles) of ε-caprolactone 2 mol-modified acrylic acid, 576 g (8.0 moles) of acrylic acid, and 3.3 g of hydroquinone were added, and the mixture was heated while stirring to 100° C. for uniform dissolution. After that, 10.0 g of triphenyl phosphine were added thereto, and the mixture was heated to 110° C. to perform a reaction for 2 hours, and then after, 2.7 g of triphenyl phosphine were further added to the mixture. The temperature of the mixture was elevated to 120° C. to perform a reaction for 12 hours. To the obtained reaction solution, 1967 g of "SolvEsso 150" and 1368 g (9.0 moles) of tetrahydrophthalic anhydride were added to perform a reaction at 110° C. for 4 hours. Furthermore, to the obtained reaction solution, 1136 g (8.0 moles) of glycidyl methacrylate were added to perform a reaction at 115° C. for 4 hours. After that, to the obtained reaction solution, 600 g (6.0 moles) of succinic anhydride were added to perform a reaction at 115° C. for 4 hours, thereby obtaining a resin solution having an acid value of the solid content of 66 mgKOH/g and a solid content of 62%, which was designated as resin solution A-13.

Example 14

Preparation of a Resin Solution (A-14) Including an Acid Group-Containing Vinyl Ester Resin (A)

To 200 g of diethylene glycol monoethyl ether acetate, 214 g of an ortho-cresol novolak-type epoxy resin "EPICLON N-695" (number of the glycidyl groups (total number of the aromatic rings): 1.0 mole), 60.0 g (0.2 mole) of ε-caprolactone 2 mol-modified acrylic acid, 57.6 g (0.8 mole) of acrylic acid, and 0.33 g of hydroquinone were added, and the mixture was heated while stirring to 100° C. for uniform dissolution. After that, 1.0 g of triphenyl phosphine were added thereto, and the mixture was heated to 110° C. to perform a reaction for 2 hours, and then, 0.27 g of triphenyl phosphine were further added to the mixture. The temperature of the mixture was elevated to 120° C. to perform a reaction for 12 hours. To the obtained reaction solution, 200 g of "SolvEsso 150" and 137 g (0.9 mole) of tetrahydrophthalic anhydride were added to perform a reaction at 110° C. for 4 hours. Furthermore, to the obtained reaction solution, 121 g (0.85 moles) of glycidyl methacrylate were added to perform a reaction at 115° C. for 4 hours. After that, to the obtained reaction solution, 65.0 g (0.65 mole) of succinic anhydride were added to perform a reaction at 115° C. for 4 hours, thereby obtaining a resin solution having an acid value of the solid content of 63 mgKOH/g and a solid content of 62%, which was designated as resin solution A-14.

Example 15

Preparation of a Resin Solution (A-15) Including an Acid Group-Containing Vinyl Ester Resin (A)

To 214 g of diethylene glycol monoethyl ether acetate, 214 g of an ortho-cresol novolak-type epoxy resin "EPICLON N-695" (number of the glycidyl groups (total number of the aromatic rings): 1.0 mole), 60.0 g (0.2 mole) of ε-caprolactone 2 mol-modified acrylic acid, 57.6 g (0.8 mole) of acrylic acid, and 0.33 g of hydroquinone were added, and the mixture was heated while stirring to 100° C. for uniform dissolution. After that, 1.0 g of triphenyl phosphine were added thereto, and the mixture was heated to 110° C. to perform a reaction for 2 hours, and then, 0.27 g of triphenyl phosphine were further added to the mixture. The temperature of the mixture was elevated to 120° C. to perform a reaction for 12 hours. To the obtained reaction solution, 214 g of "SolvEsso 150", 152 g (1.0 mole) of tetrahydrophthalic anhydride, 80.0 g (0.8 mole) of succinic anhydride and 135 g (0.95 mole) of glycidyl methacrylate were added to perform a reaction at 115° C. for 8 hours, thereby obtaining a resin solution having an acid value of the solid content of 71 mgKOH/g and a solid content of 62%, which was designated as resin solution A-15.

Example 16

Preparation of a Resin Solution (A-16) Including an Acid Group-Containing Vinyl Ester Resin (A)

To 257 g of diethylene glycol monoethyl ether acetate, 214 g of an ortho-cresol novolak-type epoxy resin "EPICLON N-695" (number of the glycidyl groups (total number of the aromatic rings): 1.0 mole), 60.0 g (0.2 mole) of ε-caprolactone 2 mol-modified acrylic acid, 57.6 g (0.8 mole) of acrylic acid, and 0.33 g of hydroquinone were added, and the mixture was heated while stirring to 100° C. for uniform dissolution. After that, 1.0 g of triphenyl phosphine were added thereto, and the mixture was heated to 110° C. to perform a reaction for 2 hours, and then, 0.27 g of triphenyl phosphine were further added to the mixture. The temperature of the mixture was elevated to 120° C. to perform a reaction for 12 hours. To the obtained reaction solution, 257 g of "SolvEsso 150", 213 g (1.4 moles) of tetrahydrophthalic anhydride, 95.0 g (0.95 mole) of succinic anhydride, and 199 g (1.4 moles) of glycidyl methacrylate were added to perform a reaction at 115° C. for 8 hours, thereby obtaining a resin solution having an acid value of the solid content of 66 mgKOH/g and a solid content of 62%, which was designated as resin solution A-16.

TABLE 2

| | | Example No. | | | | | | | |
|---|---|---|---|---|---|---|---|---|---|
| Resin solution | | 9<br>A-9 | 10<br>A-10 | 11<br>A-11 | 12<br>A-12 | 13<br>A-13 | 14<br>A-14 | 15<br>A-15 | 16<br>A-16 |
| Composition | N695 | 1 | 1 | 1 | 1 | 1 | 1 | 1 | 1 |
| of raw | AA | 0.8 | 0.8 | 0.8 | 0.8 | 0.8 | 0.8 | 0.8 | 0.8 |
| materials | M5300 | 0.2 | 0.2 | 0.2 | 0.2 | 0.2 | 0.2 | 0.2 | 0.2 |
| | THPA1 | 0.9 | 0.9 | 1.8 | 2.35 | 0.9 | 0.9 | 1.0 | 1.4 |
| | GMA | 0.8 | 0.85 | 0.95 | 1.4 | 0.8 | 0.85 | 0.95 | 1.4 |
| | THPA2 | 0.6 | 0.65 | — | — | — | — | — | — |
| | SA | — | — | — | — | 0.6 | 0.65 | 0.8 | 0.95 |
| DBeq | | 1.78 | 1.85 | 1.95 | 2.4 | 1.8 | 1.85 | 1.95 | 2.4 |
| Generation No. of double bonds | | 2 | 2 | 2 | 3 | 2 | 2 | 2 | 3 |
| Synthesis method | | Sequential | Sequential | Simultaneous | Simultaneous | Sequential | Sequential | Simultaneous | Simultaneous |
| Acid value | | 63 | 60 | 67 | 62 | 66 | 63 | 71 | 66 |

(The compositions of raw materials shown in Table 2 are expressed in molar ratios, and each of the abbreviations indicates as follows:

N695: Ortho-cresol novolak-type epoxy resin ["EPICLON N-695" manufactured by Dainippon Ink and Chemicals, Inc., softening point 95° C., epoxy equivalent 214, average number of functional groups 7.6]

AA: Acrylic acid

M5300: ε-caprolactone 2 mol-modified acrylic acid ["ARONIX M-5300" manufactured by Toa Synthetic Chemical Co., Ltd., molecular weight 300]

THPA1: Tetrahydrophthalic anhydride used in Step 1 or Method 2

GMA: Glycidyl methacrylate

SA: Succinic anhydride

THPA2: Tetrahydrophthalic anhydride used in Step 4

DBeq: Number of the radically-polymerizable unsaturated double bonds per aromatic ring Generation No. of double bonds: Generation No. of the radically-polymerizable unsaturated double bonds)

Comparative Example 1

Preparation of a Comparative Photosensitive Resin

To 1091 g of diethylene glycol monoethyl ether acetate, 2080 g of an ortho-cresol novolak-type epoxy resin ["EPICLON N-665" manufactured by Dainippon Ink and Chemicals, Inc., softening point 65° C., epoxy equivalent 208, average number of functional groups 4.6] (number of the glycidyl groups (total number of the aromatic rings): 10.0 moles), 720 g (10.0 moles) of acrylic acid, and 1.4 g of hydroquinone were added, and the mixture was heated while stirring to 100° C. for uniform dissolution. After that, 8.5 g of triphenyl phosphine were added thereto, and the mixture was heated to 110° C. to perform a reaction for 2 hours, and then, 2.8 g of triphenyl phosphine were added thereto to perform a reaction for 10 hours. To the obtained reaction solution, 1091 g of "SolvEsso 150" and 760 g (5.0 moles) of tetrahydrophthalic anhydride were added to perform a reaction at 110° C. for 4 hours, thereby obtaining a resin solution having an acid value of the solid content of 84 mgKOH/g and a solid content of 62%, which was designated as resin solution A'-1.

Comparative Example 2

Preparation of a Comparative Photosensitive Resin

To 1109 g of diethylene glycol monoethyl ether acetate, 2080 g of an ortho-cresol novolak-type epoxy resin "EPICLON N-695" (number of the glycidyl groups (total number of the aromatic rings): 10.0 moles), 720 g (10.0 moles) of acrylic acid, and 1.4 g of hydroquinone were added, and the mixture was heated while stirring to 100° C. for uniform dissolution. After that, 8.5 g of triphenyl phosphine were added thereto, and the mixture was heated to 110° C. to perform a reaction for 2 hours, and then 2.8 g of triphenyl phosphine were added thereto to perform a reaction for 10 hours. To the obtained reaction solution, 1109 g of "SolvEsso 150" and 760 g (5.0 moles) of tetrahydrophthalic anhydride were added to perform a reaction at 110° C. for 4 hours, thereby obtaining a resin solution having an acid value of the solid content of 82 mgKOH/g and a solid content of 62%, which was designated as resin solution A'-2.

Comparative Example 3

Preparation of a Comparative Photosensitive Resin

To 1336 g of diethylene glycol monoethyl ether acetate, 2140 g of an ortho-cresol novolak-type epoxy resin "EPICLON N-695" (number of the glycidyl groups (total number of the aromatic rings): 10.0 moles), 720 g (10.0 moles) of acrylic acid, and 1.4 g of hydroquinone were added, and the mixture was heated while stirring to 100° C. for uniform dissolution. After that, 8.6 g of triphenyl phosphine were added thereto, and the mixture was heated to 110° C. to perform a reaction for 2 hours, and then, 2.9 g of triphenyl phosphine were added thereto, and the mixture was heated to 120° C. to perform a reaction for 10 hours. To the obtained reaction solution, 1336 g of "SolvEsso 150" and 1216 g (8.0 moles) of tetrahydrophthalic anhydride were added to perform a reaction at 110° C. for 4 hours. Furthermore, to the obtained reaction solution, 284 g (2.0 moles) of glycidyl methacrylate were added to further perform a reaction at 110° C. for 4 hours, thereby obtaining a resin solution having an acid value of the solid content of 81 mgKOH/g and a solid content of 62%, which was designated as resin solution A'-3.

Comparative Example 4

Preparation of a Comparative Photosensitive Resin

To 1510 g of diethylene glycol monoethyl ether acetate, 2140 g of an ortho-cresol novolak-type epoxy resin "EPICLON N-695" (number of the glycidyl groups (total number of the aromatic rings): 10.0 moles), 720 g (10.0 moles) of acrylic acid, and 1.4 g of hydroquinone were added, and the mixture was heated while stirring to 100° C. for uniform dissolution. After that, 8.6 g of triphenyl phosphine were added thereto, and the mixture was heated to 110° C. to perform a reaction for 2 hours, and then, 2.9 g of triphenyl phosphine were added thereto, and the mixture was heated to 120° C. to perform a reaction for 10 hours. To the obtained reaction solution, 1624 g of "SolvEsso 150" and 1216 g (8.0 moles) of tetrahydrophthalic anhydride were added to perform a reaction at 115° C. for 4 hours. Furthermore, to the obtained reaction solution, 852 g (6.0 moles) of glycidyl methacrylate were added to further perform a reaction at 115° C. for 4 hours, thereby obtaining a resin solution having an acid value of the solid content of 26 mgKOH/g and a solid content of 62%, which was designated as resin solution A'-4.

Comparative Example 5

Preparation of a Comparative Photosensitive Resin

To 1515 g of diethylene glycol monoethyl ether acetate, 2140 g of an ortho-cresol novolak-type epoxy resin "EPICLON N-695" (number of the glycidyl groups (total number of the aromatic rings): 10.0 moles), 720 g (10.0 moles) of acrylic acid, and 1.4 g of hydroquinone were added, and the mixture was heated while stirring to 100° C. for uniform dissolution. After that, 8.6 g of triphenyl phosphine were added thereto, and the mixture was heated to 110° C. to perform a reaction for 2 hours, and then, 2.9 g of triphenyl phosphine were added thereto, and the mixture was heated to 120° C. to perform a reaction for 10 hours. To the obtained reaction solution, 1515 g of "SolvEsso 150" and 1444 g (9.5 moles) of tetrahydrophthalic anhydride were added to perform a reaction at 115° C. for 4 hours. Furthermore, to the obtained reaction solution, 639 g (4.5 moles) of glycidyl methacrylate were added to further perform a reaction at 115° C. for 4 hours, thereby obtaining a resin solution having an acid value of the solid content of 60 mgKOH/g and a solid content of 62%, which was designated as resin solution A'-5.

TABLE 3

| | | Comparative Example No. | | | | |
|---|---|---|---|---|---|---|
| | | 1 | 2 | 3 | 4 | 5 |
| Resin solution | | A'-1 | A'-2 | A'-3 | A'-4 | A'-5 |
| Composition of raw materials | N695 | — | 1 | 1 | 1 | 1 |
| | N665 | 1 | — | — | — | — |
| | AA | 1 | 1 | 1 | 1 | 1 |
| | M5300 | — | — | — | — | — |
| | THPA | 0.5 | 0.5 | 0.8 | 0.8 | 0.95 |
| | SA | — | — | — | — | — |
| | GMA | — | — | 0.2 | 0.6 | 0.45 |
| DBeq | | 1 | 1 | 1.2 | 1.6 | 1.45 |
| Generation No. of double bonds | | 0 | 0 | 1 | 1 | 1 |
| Synthesis method | | — | — | Sequential | Sequential | Sequential |
| Acid value | | 84 | 82 | 81 | 26 | 60 |

(The compositions of raw materials shown in Table 1 are expressed in molar ratios, and each of the abbreviations indicates as follows:

N695: Ortho-cresol novolak-type epoxy resin ["EPICLON N-695" manufactured by Dainippon Ink and Chemicals, Inc., softening point 95° C., epoxy equivalent 214, average number of functional groups 7.6]

AA: Acrylic acid

M5300: ε-caprolactone 2 mol-modified acrylic acid ["ARONIX M-5300" manufactured by Toa Synthetic Chemical Co., Ltd., molecular weight 300]

THPA1: Tetrahydrophthalic anhydride

GMA: Glycidyl methacrylate

SA: Succinic anhydride

THPA2: Tetrahydrophthalic anhydride

DBeq: Number of the radically-polymerizable unsaturated double bonds per aromatic ring Generation No. of double bonds: Generation No. of the radically-polymerizable unsaturated double bonds)

[Preparation of a Thermally Reactive Curing Agent]

919 g of diethylene glycol monoethyl ether acetate was heated to 100° C., and 2140 g of an ortho-cresol novolak-type epoxy resin ["EPICLON N-695" manufactured by Dainippon Ink and Chemicals, Inc., softening point 95° C., epoxy equivalent 214] were uniformly dissolved therein, thereby obtaining a resin solution having a solid content of 70%, which was designated as resin solution B-1.

Examples 17 to 32, and Comparative Examples 6 to 10

According to the blending compositions shown in Tables 1 and 2 (the values are expressed in parts by weight), the photosensitive resin compositions were blended, and stirred using a planetary mixer equipped with a cooler to prepare a solution of a resist ink resin. The drying properties, sensitivity, and alkali developability of the resin composition for a resist ink, and properties of the coating film thereof are shown in Table 3. In addition, drying properties, sensitivity, and alkali developability of the resin composition for a resist ink, and properties of the coating film were evaluated using the following methods. However, with regard to the evaluation of the properties of the coating film, the resist ink resin composition was applied onto a polyimide film substrate to a thickness of 60 μm (before drying), and predried at 80° C. for 30 minutes, and then, ultraviolet light rays were irradiated thereon at an exposure amount of 200 mJ/cm$^2$. Then, the film was developed using a 1 wt % aqueous sodium carbonate solution at 30° C. under a spray pressure of 2.0 kg/cm$^2$ for 60 seconds, and then cured at 150° C. for 30 minutes to prepare a cured coating film, and the cured coating film was evaluated.

Test Methods and Evaluation Methods (1) Drying Properties

The coating film was predried at 80° C. for 30 minutes. After that, a solder mask pattern was brought into contact with the surface of the coating film that had been cooled to room temperature. The solder mask pattern was peeled off from the coating film to evaluate the conditions.

Excellent: The coating film and the pattern were not adhered to each other at all, and easily peeled off.

Good: The pattern was peeled off without any trace, but some remained adhered.

Inferior: The coating film was adhered to the solder mask pattern when peeled off.

(2) Sensitivity

A 21-stage Step Tablet (manufactured by Kodak) was adhered to the coating film that had been predried at 80° C. for 30 minutes, and ultraviolet rays were irradiated on the film at an exposure amount of 30 mJ/cm$^2$ and 200 mJ/cm$^2$, respectively, using a metal halide lamp exposure device (manufactured by ORC Co., Ltd.) and a UV integrating intensimeter manufactured by EYE GRAPHICS Co., Ltd. After that, development was performed using a 1 wt % aqueous sodium carbonate solution maintained at 30° C. at a spray pressure of 2.0 kg/cm$^2$ for 60 seconds, and the stage of the part of the exposed area that was not removed after development was counted. Larger numbers of the stage indicate higher sensitivity.

(3) Development Time

A solder mask pattern was adhered to the coating film that had been predried at 80° C. for 30 minutes, and ultraviolet rays were irradiated on the film at an exposure amount of 200 mJ/cm². After that, development was performed using a 1 wt % aqueous sodium carbonate solution maintained at 30° C. at a spray pressure of 2.0 kg/cm². During the development, the developing state of the unexposed area was evaluated with eyes using a magnifying glass every 15 seconds. Here, the time when the ink was completely removed, thereby leading to complete development, was taken as development time.

(4) Heat Control Range

The predrying time was changed from 20 minutes at 80° C. to 90 minutes at 80° C. at an interval of 10 minutes to obtain coating films thereof, and each coating film was subjected to the same evaluation test as for the development time in (5). Here, the maximum predrying time (minutes) where development can be completed for 60 seconds was taken as a heat control range.

(5) Soldering Heat Resistance

The cured coating film was immersed in a solder bath at 260° C. for 10 seconds in accordance with JIS C 6481, and the same process was repeated. The maximum number of times when there was no change in appearance was recorded.

(6) Pencil Hardness

The cured coating film was tested in accordance with a test method of JIS K 5400 to measure the highest hardness at which the coating film was not scratched.

(7) Adhesiveness

The cured coating film was cross-cut to 10×10 squares of 1 mm×1 mm. Then, it was subjected to a peel test with a cellophane adhesive tape to evaluate the separation state with naked eyes.

Excellent: Not peeled off.
Good: Peeled off in 1 to 10 cross-cut portions.
Inferior: Peeled off in more than 10 cross-cut portions.

(8) Chemical Resistance

The cured coating film was immersed in a 10 wt % hydrochloric acid solution for 30 minutes to evaluate the state of the coating film.

Excellent: Not changed at all.
Inferior: Coating film was swollen and peeled off.

(9) Solvent Resistance

The cured coating film was immersed in methylene chloride for 30 minutes to evaluate the state of the coating film.

Excellent: Not changed at all.
Inferior: Coating film was swollen and peeled off.

TABLE 4

| | | Example No. | | | | | | | |
|---|---|---|---|---|---|---|---|---|---|
| | | 17 | 18 | 19 | 20 | 21 | 22 | 23 | 24 |
| | Type of resin solution | A-1 | A-2 | A-3 | A-4 | A-5 | A-6 | A-7 | A-8 |
| Blending | Resin solution | 100 | 100 | 100 | 100 | 100 | 100 | 100 | 100 |
| | IRGAGURE 907 | 8 | 8 | 8 | 8 | 8 | 8 | 8 | 8 |
| | 2,4-Diethylthioxantone | 0.8 | 0.8 | 0.8 | 0.8 | 0.8 | 0.8 | 0.8 | 0.8 |
| | N-695 | 40 | 40 | 40 | 40 | 40 | 40 | 40 | 40 |
| | DPHA | 8 | 8 | 8 | 8 | 8 | 8 | 8 | 8 |
| | Phthalocyanine green | 0.5 | 0.5 | 0.5 | 0.5 | 0.5 | 0.5 | 0.5 | 0.5 |
| | Talc | 8 | 8 | 8 | 8 | 8 | 8 | 8 | 8 |
| Physical properties | (1) Drying properties | Excellent | Excellent | Excellent | Excellent | Excellent | Excellent | Excellent | Excellent |
| | (2) Sensitivity at 30 mJ/cm² | 8 | 8 | 8 | 10 | 7 | 8 | 8 | 9 |
| | Sensitivity at 200 mJ/cm² | 14 | 14 | 15 | 17 | 13 | 13 | 14 | 16 |
| | (3) Development time | 60 | 60 | 60 | 75 | 45 | 45 | 45 | 60 |
| | (4) Heat control range at 80° C. | 40 | 40 | 30 | 30 | 60 | 50 | 40 | 40 |
| | (5) Soldering heat resistance | 3 | 3 | 3 | 3 | 3 | 3 | 3 | 3 |
| | (6) Pencil hardness | 6H | 6H | 6H | 6H | 6H | 6H | 6H | 5H |
| | (7) Adhesiveness | Excellent | Excellent | Excellent | Excellent | Excellent | Excellent | Excellent | Excellent |
| | (8) Chemical resistance | Excellent | Excellent | Excellent | Excellent | Excellent | Excellent | Excellent | Excellent |
| | (9) Solvent resistance | Excellent | Excellent | Excellent | Excellent | Excellent | Excellent | Excellent | Excellent |

TABLE 5

| | | Example No. | | | | | | | |
|---|---|---|---|---|---|---|---|---|---|
| | | 25 | 26 | 27 | 28 | 29 | 30 | 31 | 32 |
| | Type of resin solution | A-9 | A-10 | A-11 | A-12 | A-13 | A-14 | A-15 | A-16 |
| Blending composition | Resin solution | 100 | 100 | 100 | 100 | 100 | 100 | 100 | 100 |
| | IRGAGURE 907 | 8 | 8 | 8 | 8 | 8 | 8 | 8 | 8 |
| | 2,4-Diethylthioxantone | 0.8 | 0.8 | 0.8 | 0.8 | 0.8 | 0.8 | 0.8 | 0.8 |
| | N-695 | 40 | 40 | 40 | 40 | 40 | 40 | 40 | 40 |
| | DPHA | 8 | 8 | 8 | 8 | 8 | 8 | 8 | 8 |
| | Phthalocyanine green | 0.5 | 0.5 | 0.5 | 0.5 | 0.5 | 0.5 | 0.5 | 0.5 |
| | Talc | 8 | 8 | 8 | 8 | 8 | 8 | 8 | 8 |
| Physical properties | (1) Drying properties | Excellent | Excellent | Excellent | Excellent | Excellent | Excellent | Good | Good |
| | (2) Sensitivity at 30 mJ/cm² | 7 | 7 | 7 | 9 | 6 | 7 | 7 | 9 |
| | Sensitivity at 200 mJ/cm² | 13 | 13 | 14 | 15 | 13 | 13 | 13 | 14 |
| | (3) Development time | 45 | 45 | 45 | 45 | 30 | 30 | 30 | 45 |
| | (4) Heat control range at 80° C. | 70 | 70 | 60 | 60 | 90 | 90 | 80 | 70 |
| | (5) Soldering heat resistance | 3 | 3 | 3 | 3 | 3 | 3 | 3 | 3 |
| | (6) Pencil hardness | 6H | 5H | 5H | 5H | 5H | 5H | 5H | 5H |

TABLE 5-continued

| | | Example No. | | | | | | | |
|---|---|---|---|---|---|---|---|---|---|
| | | 25 | 26 | 27 | 28 | 29 | 30 | 31 | 32 |
| Type of resin solution | | A-9 | A-10 | A-11 | A-12 | A-13 | A-14 | A-15 | A-16 |
| (7) Adhesiveness | | Excellent | Excellent | Excellent | Excellent | Excellent | Excellent | Excellent | Excellent |
| (8) Chemical resistance | | Excellent | Excellent | Excellent | Excellent | Excellent | Excellent | Excellent | Excellent |
| (9) Solvent resistance | | Excellent | Excellent | Excellent | Excellent | Excellent | Excellent | Excellent | Excellent |

TABLE 6

| | | Comparative Example No. | | | | |
|---|---|---|---|---|---|---|
| | | 6 | 7 | 8 | 9 | 10 |
| | Type of resin | A-1' | A-2' | A-3' | A-4' | A-5' |
| Blending composition | Resin solution | 100 | 100 | 100 | 100 | 100 |
| | IRGAGURE 907 | 8 | 8 | 8 | 8 | 8 |
| | 2,4-Diethylthioxantone | 0.8 | 0.8 | 0.8 | 0.8 | 0.8 |
| | N-695 | 40 | 40 | 40 | 40 | 40 |
| | DPHA | 8 | 8 | 8 | 8 | 8 |
| | Phthalocyanine green | 0.5 | 0.5 | 0.5 | 0.5 | 0.5 |
| | Talc | 8 | 8 | 8 | 8 | 8 |
| Physical properties | (1) Drying properties | Good | Excellent | Excellent | Excellent | Excellent |
| | (2) Sensitivity at 30 mJ/cm$^2$ | 0 | 0 | 3 | 7 | 5 |
| | Sensitivity at 200 mJ/cm$^2$ | 6 | 7 | 9 | 12 | 10 |
| | (3) Development time | 45 | 60 | 60 | Impossible | 75 |
| | (4) Heat control range at 80° C. | 60 | 60 | 20 | 0 | 30 |
| | (5) Soldering heat resistance | 3 | 3 | 3 | 2 | 3 |
| | (6) Pencil hardness | 6H | 6H | 6H | 6H | 6H |
| | (7) Adhesiveness | Excellent | Excellent | Excellent | Excellent | Excellent |
| | (8) Chemical resistance | Excellent | Excellent | Excellent | Excellent | Excellent |
| | (9) Solvent resistance | Excellent | Excellent | Excellent | Excellent | Excellent |

INDUSTRIAL APPLICABILITY

The photosensitive resin composition of the present invention has ultrahigh sensitivity, excellent developability, and a broad heat control range simultaneously. Accordingly, the photosensitive resin composition is useful particularly in the field of alkali-developing-type resist ink and is applicable to a direct exposure system using laser beam and to an energy-saving type curing system that has excellent productivity. Furthermore, the composition for an alkali-developing-type resist ink according to the present invention has excellent drying properties, and can produce a cured product having good balance among properties such as adhesiveness, soldering heat resistance, chemical resistance, and solvent resistance in the coating film thereof obtained after thermal curing. Therefore, the photosensitive resin composition of the present invention is of a significant industrial value as a composition for resist ink.

The invention claimed is:

1. A photosensitive resin composition, comprising an acid group-containing vinyl ester resin (A) and a photopolymerization initiator (B) as essential components, wherein;

the acid group-containing vinyl ester resin (A) has a multiple-branched molecular structure obtained by the following steps; Step (1): reacting a polybasic anhydride (a3) with an epoxy vinyl ester resin (v1) that is a reaction product of a novolac-type epoxy resin (a1), and a radically-polymerizable unsaturated-double bond-containing monocarboxylic acid (a2) to give an acid group-containing vinyl ester resin (v2), which is represented by the following general formula (2),

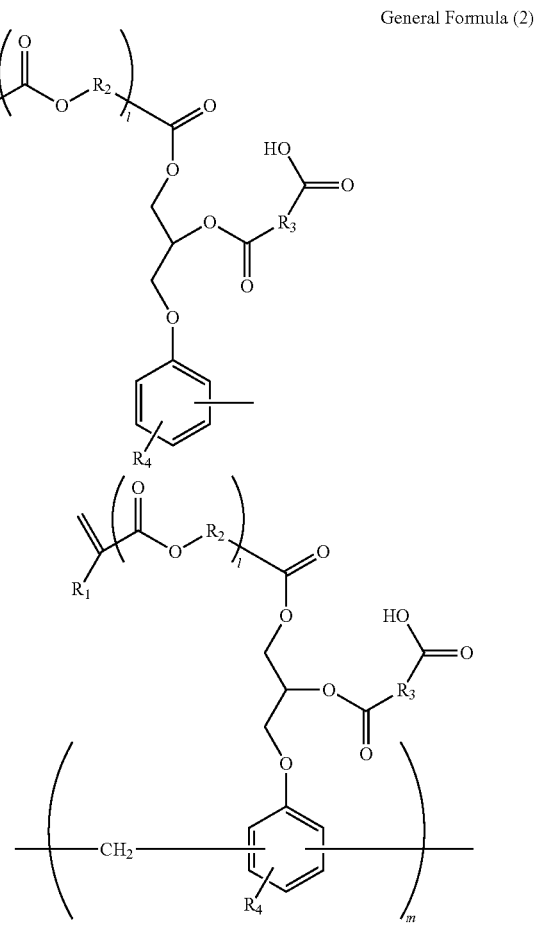

General Formula (2)

-continued

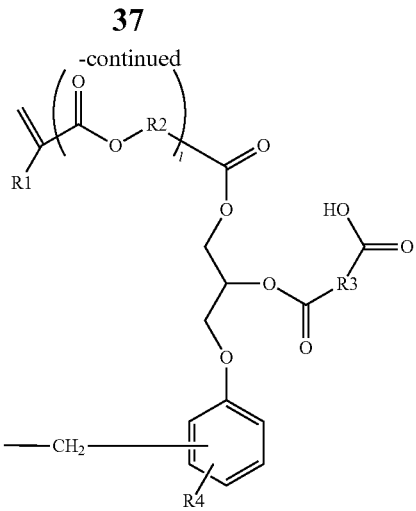

wherein $R_1$ represents a hydrogen atom or a methyl group; $R_2$ represents a hydrocarbon group having 2 to 6 carbon atoms; each l independently represents an integer of 0 to 6; $R_3$ represents a linear aliphatic hydrocarbon group or alicyclic hydrocarbon group having 2 to 10 carbon atoms; $R_4$ represents a hydrogen atom, a halogen atom, or an alkyl group having 1 to 4 carbon atoms; and m represents an integer of 0 to 9, Step (2); subsequently reacting a radically-polymerizable unsaturated-double bond-containing monoepoxy compound (a4) with an acid group in the acid-group containing vinyl ester resin (v2) obtained by the Step (1) to give a vinyl ester compound (v3), and Step (3): subsequently reacting a polybasic anhydride (3) with a secondary hydroxyl group in the vinyl ester compound (v3) obtained by the Step (2); and the acid group-containing vinyl ester resin (A) contains 1.75 to 3.5 radically-polymerizable unsaturated double bonds per aromatic ring in the acid group, wherein the radically-polymerizable unsaturated double bonds are derived from the radically-polymerizable unsaturated-double bond-containing monocarboxylic acid (a2) and the radically-polymerizable unsaturated-double bond-containing monoepoxy compound (a4), and the acid groups within a range where the acid value of the acid group-containing vinyl ester resin (A) reaches 30 to 150 mg KOH/g.

2. The photosensitive resin composition according to claim 1, wherein the acid group-containing vinyl ester resin (A) contains 2.0 to 3.5 radically-polymerizable unsaturated double bonds per aromatic ring in the multiple-branched vinyl ester resin (A).

3. The photosensitive resin composition according to claim 1, wherein the radically-polymerizable unsaturated double bond-containing monocarboxylic acid (a2) is a compound represented by the following general formula (1):

General Formula (1)

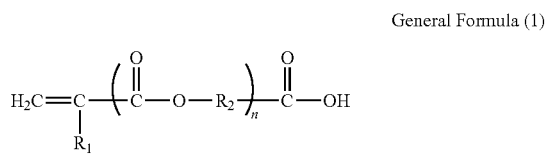

wherein $R_1$ represents a hydrogen atom or a methyl group, $R_2$ represents a hydrocarbon group having 2 to 6 carbon atoms, and n represents an integer of 1 to 6.

4. The photosensitive resin composition according to claim 1, wherein the novolak-type epoxy resin has an average number of benzene rings of 4 to 11.

5. The photosensitive resin composition according to any one of claims 1 to 3 and 4, further comprising a thermocurable curing agent (C) and a diluent (D) in addition to the acid group-containing vinyl ester resin (A) and the photopolymerization initiator (B).

6. A novel vinyl ester resin,
which is an acid group-containing vinyl ester resin (A) having a multiple-branched molecular structure obtained by the following steps;

Step (1): reacting a polybasic anhydride (a3) with an epoxy vinyl ester resin (v1) that is a reaction product of a novolak-type epoxy resin (a1), and a radically-polymerizable unsaturated double bond-containing monocarboxylic acid (a2) to give an acid group-containing vinyl ester resin (v2), which is represented by the following general formula (2), General Formula (2)

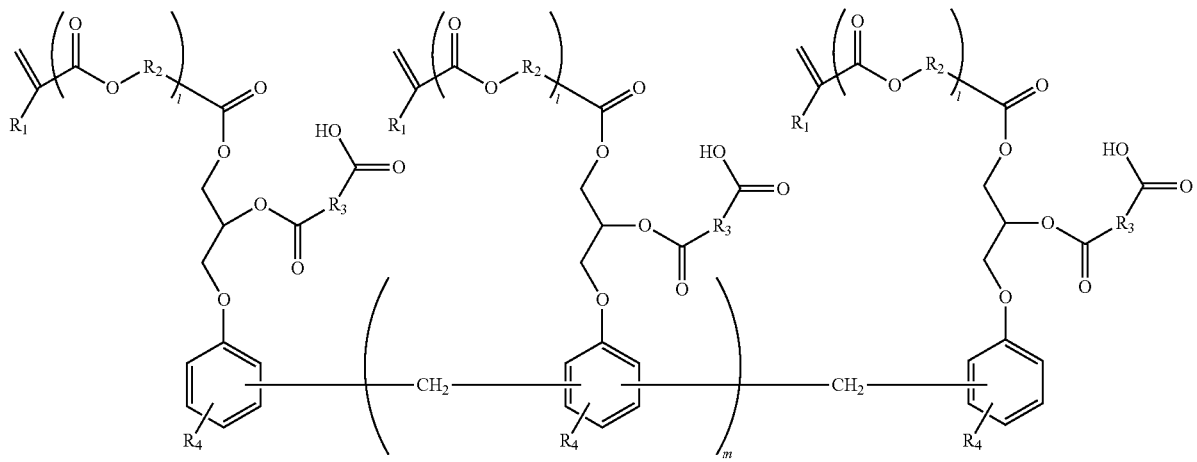

wherein $R_1$ represents a hydrogen atom or a methyl group; $R_2$ represents a hydrocarbon group having 2 to 6 carbon atoms; each l independently represents an integer of 0 to 6; $R_3$ represents a linear aliphatic hydrocarbon group or alicyclic hydrocarbon group having 2 to 10 carbon atoms; $R_4$ represents a hydrogen atom, a halogen atom, or an alkyl group having 1 to 4 carbon atoms; and m represents an integer of 0 to 9, Step (2): subsequently reacting a radically-polymerizable unsaturated-double bond-containing monoepoxy compound (a4) with an acid group in the acid group-containing vinyl ester resin (v2) obtained by the Step (1) to give a vinyl ester compound (v3), and Step (3): subsequently reacting a polybasic anhydride (a3) with a secondary hydroxyl group in the vinyl ester compound (v3) obtained by the of Step (2); and the acid group-containing vinyl ester resin (A) contains 1.75 to 3.5 radically-polymerizable unsaturated double bonds per aromatic ring, wherein the radically-polymerizable unsaturated double bonds are derived from the radically-polymerizable unsaturated-double bond-containing monocarboxylic acid (a2) and the radically-polymerizable unsaturated-double bond-containing monoepoxy compound (a4), and the acid groups within a range where the acid value of the acid group-containing vinyl ester resin (A) reaches 30 to 150 mg KOH/g.

\* \* \* \* \*